(12) United States Patent
Taya

(10) Patent No.: US 11,561,262 B2
(45) Date of Patent: *Jan. 24, 2023

(54) SIGNAL TRANSMISSION CIRCUIT, BATTERY MONITORING DEVICE, AND BATTERY MONITORING METHOD

(71) Applicant: LAPIS Semiconductor Co., Ltd., Yokohama (JP)

(72) Inventor: Takashi Taya, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/206,109

(22) Filed: Mar. 18, 2021

(65) Prior Publication Data
US 2021/0208204 A1 Jul. 8, 2021

Related U.S. Application Data

(63) Continuation of application No. 16/008,048, filed on Jun. 14, 2018, now Pat. No. 10,983,171.

(30) Foreign Application Priority Data

Jun. 15, 2017 (JP) .............................. JP2017-117998

(51) Int. Cl.
*B60L 1/00* (2006.01)
*B60L 3/00* (2019.01)
(Continued)

(52) U.S. Cl.
CPC ........... *G01R 31/396* (2019.01); *G01R 15/18* (2013.01); *H01F 38/14* (2013.01); *H02J 7/0013* (2013.01);
(Continued)

(58) Field of Classification Search
CPC ....... G01R 31/396; G01R 15/18; H01F 38/14; H02J 7/025; H02J 50/12; H02J 50/80; H02J 7/0021; H02J 7/0047; H02J 50/40; H02J 7/0013; H02J 2310/48; Y02E 60/10; H01M 10/425; H04B 5/0031; H04B 5/0037
(Continued)

(56) References Cited

U.S. PATENT DOCUMENTS 10,983,171 B2 * 4/2021 Taya ....................... H02J 50/80

* cited by examiner

*Primary Examiner* — Richard Tan
(74) *Attorney, Agent, or Firm* — JCIPRNET

(57) ABSTRACT

A signal transmission device and a battery monitoring device are provided. The signal transmission device is connected to an operation device including an operation circuit for performing an operation based on a first voltage, a measurement circuit for obtaining measurement data based on the first voltage, and a process control circuit for operating based on a lower voltage and control an operation of the operation circuit based on the measurement data, and transmits and receives signals between the process control circuit and the measurement circuit. The signal transmission device includes a power reception circuit for supplying power from the power transmission circuit to the measurement circuit to acquire measurement data, and a power transmission circuit for transmitting the power from a process control circuit to the power reception circuit to receive the measurement data from the power reception circuit and supply the same to the process control circuit.

6 Claims, 23 Drawing Sheets

(51) Int. Cl.
*H02G 3/00* (2006.01)
*G01R 31/396* (2019.01)
*H02J 50/12* (2016.01)
*H02J 50/80* (2016.01)
*H01F 38/14* (2006.01)
*G01R 15/18* (2006.01)
*H02J 7/00* (2006.01)
*G01R 31/382* (2019.01)

(52) U.S. Cl.
CPC .............. *H02J 50/12* (2016.02); *H02J 50/80* (2016.02); *G01R 31/382* (2019.01); *H02J 2310/48* (2020.01)

(58) Field of Classification Search
USPC .......................................................... 307/9.1
See application file for complete search history.

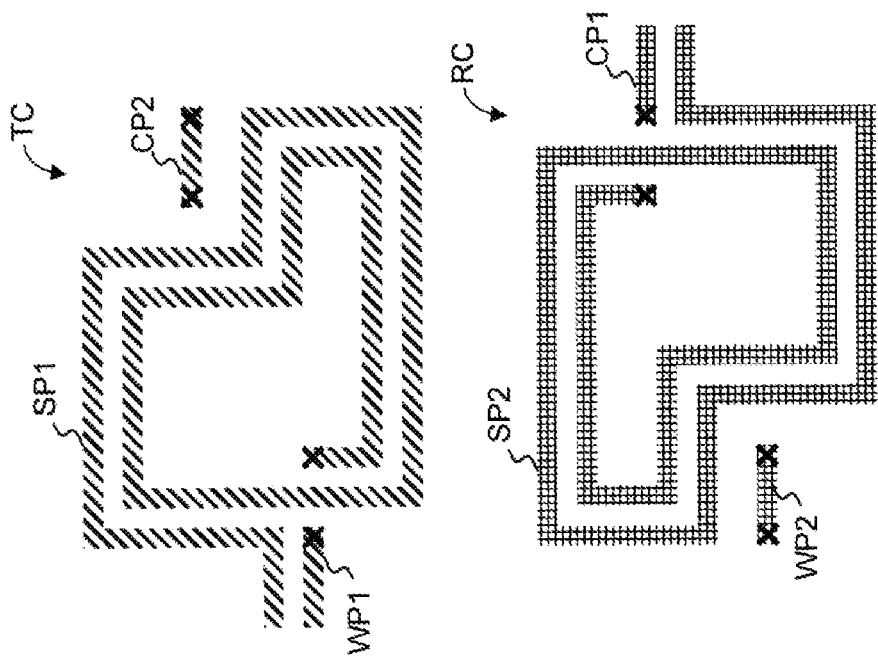
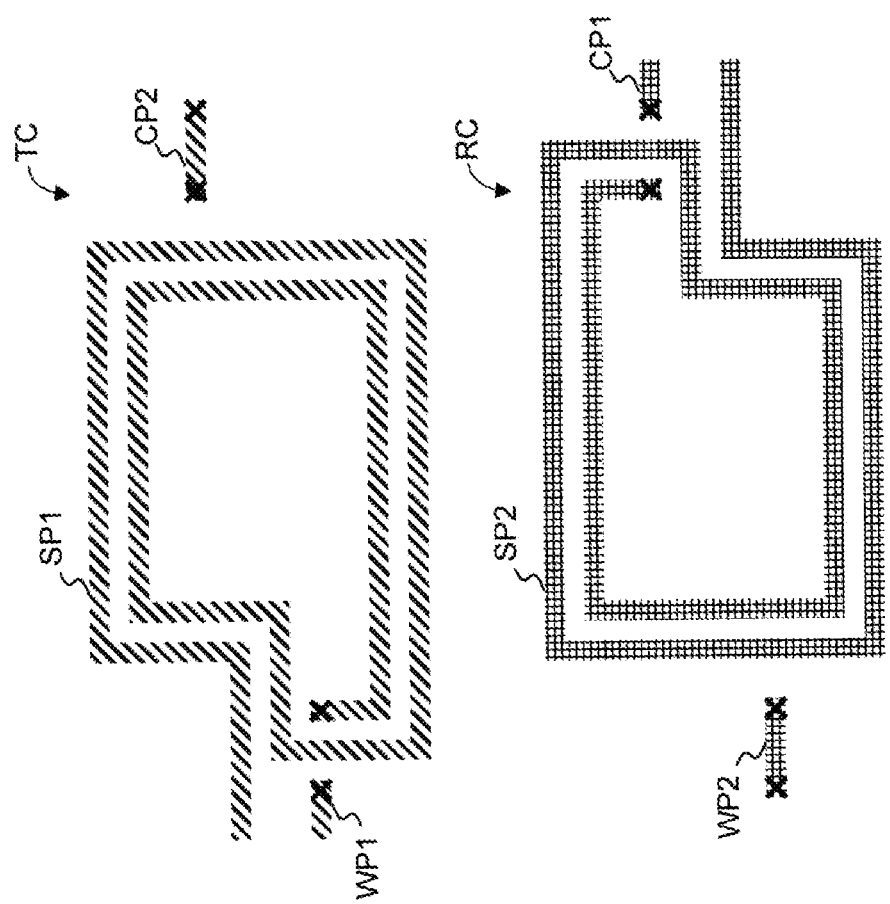
FIG. 7(a)
FIG. 7(b)

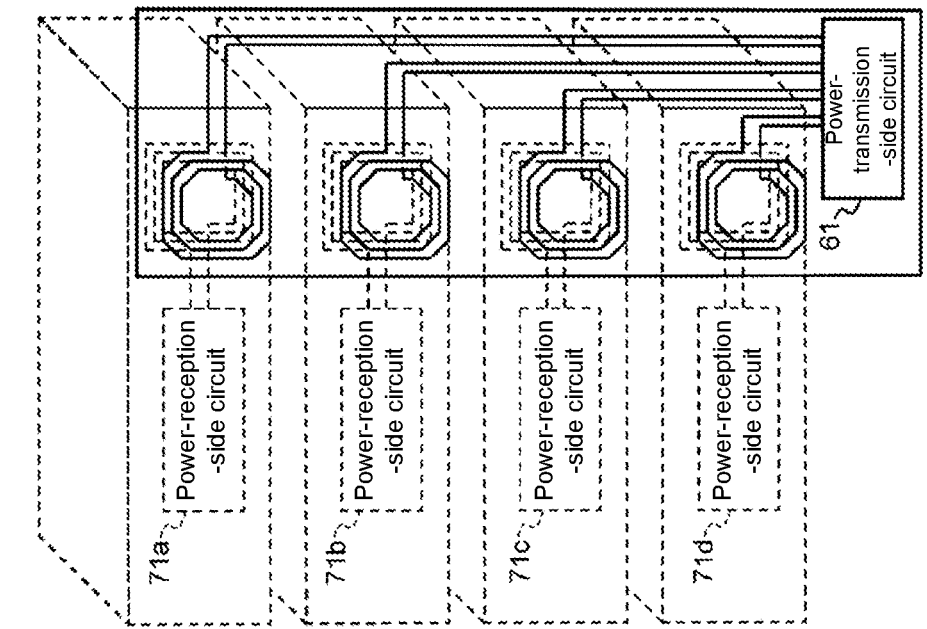
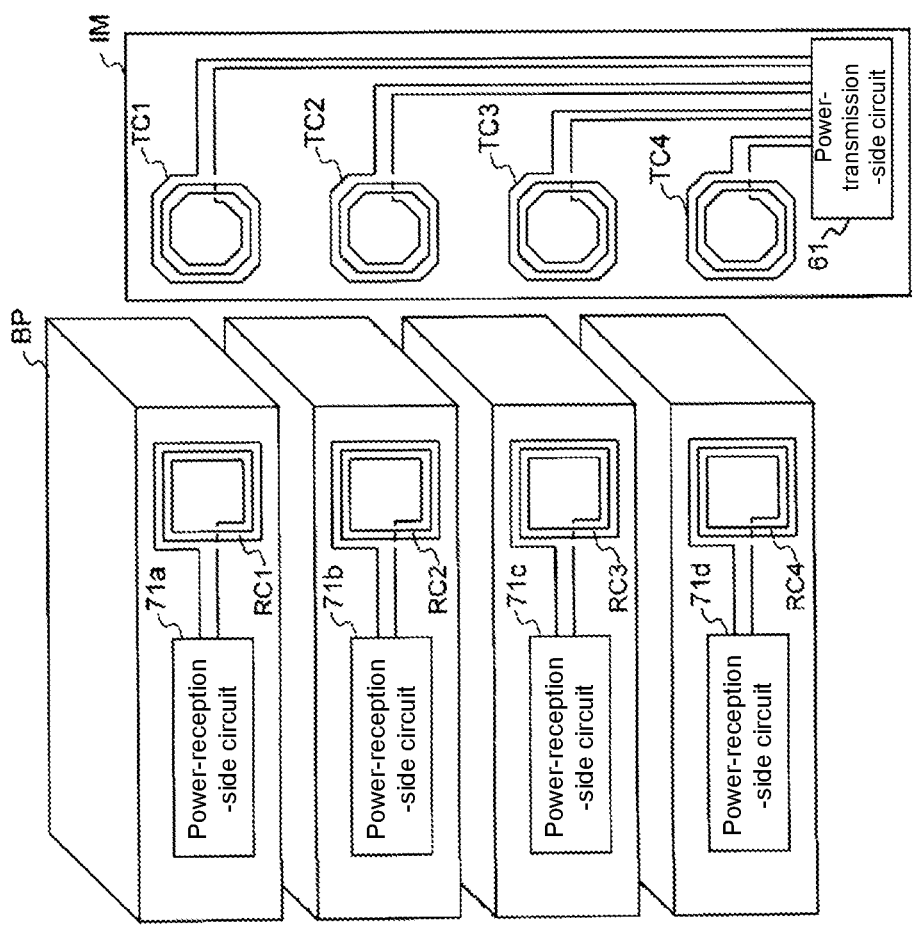
FIG. 16(a)
FIG. 16(b)

SIGNAL TRANSMISSION CIRCUIT, BATTERY MONITORING DEVICE, AND BATTERY MONITORING METHOD

CROSS-REFERENCE TO RELATED APPLICATION

This application is a Continuation of U.S. patent application Ser. No. 16/008,048 filed on Jun. 14, 2018, which claims the benefit of Japan Application no. 2017-117998, filed on Jun. 15, 2017. The entirety of the above-mentioned patent applications is hereby incorporated by reference and made a part of this specification.

BACKGROUND

Technical Field

The disclosure relates to a signal transmission circuit, a battery monitoring device, and a battery monitoring method.

Description of Related Art

In a battery device such as an electric vehicle, the entire device is controlled while monitoring much information such as voltages and temperatures of individual battery cells constituting a battery. For example, such a battery device includes a control circuit for controlling the entire device and a measurement circuit having an operational amplifier or the like for measuring voltages and temperatures of individual battery cells. The control circuit performs control based on information such as voltages and temperatures measured by the measurement circuit.

A battery is configured by connecting a large number of battery cells in series and a potential difference between both ends extends to several hundred volts. Furthermore, a potential of a terminal connected to each battery cell significantly fluctuates according to a change in an amount of electric current or polarity due to acceleration or deceleration of the electric vehicle or the like. On the other hand, the control circuit for controlling the entire device is a digital circuit operating at 5 V or less. Thus, information such as a voltage and a temperature is transmitted between blocks having a potential difference of several hundred volts. Signal transmission is performed while maintaining isolation between blocks having a potential difference.

A device using a photocoupler and an isolation transformer has been proposed as a device configured to perform signal transmission while maintaining isolation between blocks having a potential difference (for example, see Patent Document 1: Japanese Laid-Open No. 2014-135838).

In signal transmission between blocks having a potential difference, transformers, photocouplers, high-voltage-resistant semiconductor parts, and the like are used as in the above-described related art, but these parts are large and expensive. In a device requiring high reliability, a transmission path is generally duplexed. However, in this case, the number of high-voltage-resistant semiconductor parts, the number of transformers, and the number of photocouplers are doubled, and a size of the device becomes larger and the device becomes more expensive.

Also, to measure voltages and temperatures of individual battery cells, a measurement circuit including an operational amplifier and the like is provided and power is supplied to the measurement circuit. It is conceivable to supply power from the individual battery cells to the measurement circuit, but it becomes impossible to perform an operation if the battery cell is fully discharged.

Moreover, in industrial devices, office devices, household appliances, or photovoltaic power generation application devices operating with a commercial AC power supply of 100 V or more, the voltage and current of a high-voltage power line are also measured, and processing and control in a digital circuit of a low-voltage operation are performed. In this case, an issue similar to that described above is also found.

Also, because a control based on ON/OFF timings of transistors and thyristors such as a chopper control is performed in the above-described devices, timings of information transmission and reception are important, and an increase in an information delivery time and a change in a delay time cannot be tolerated.

Also, high-resistant-voltage semiconductor parts, transformers, and photocouplers are physically fixed, and positions of a transmission side and a reception side cannot be changed or rotated. For attachment and detachment thereof, connectors having contact points are adopted, and connection reliability becomes an issue. Also, these cannot be immersed in water.

SUMMARY

An embodiment of the invention provides a signal transmission device connected to an operation device including an operation circuit configured to perform an operation based on a first voltage from a power supply, a measurement circuit configured to obtain measurement data by measuring an electrical signal using the first voltage as a reference, and a process control circuit configured to operate based on a second voltage obtained by converting the first voltage into a voltage with a voltage level less than the first voltage and control an operation of the operation circuit based on the measurement data and configured to transmit and receive a signal between the process control circuit and the measurement circuit, the signal transmission device including: a power transmission circuit having a power-transmission-side resonance circuit including a power transmission coil and a power-transmission-side resonance capacitor and configured to wirelessly perform transmission of power and transmission and reception of information according to an alternating current (AC) magnetic field from the power transmission coil; and a power reception circuit having a power-reception-side resonance circuit including a power reception coil and a power-reception-side resonance capacitor and configured to wirelessly perform reception of power and transmission and reception of information via the power reception coil according to the AC magnetic field, wherein the power reception circuit supplies the power from the power transmission circuit to the measurement circuit and acquires the measurement data from the measurement circuit to transmit the acquired measurement data to the power transmission circuit, and wherein the power transmission circuit transmits the power from the process control circuit to the power reception circuit and receives the measurement data from the power reception circuit to supply the received measurement data to the process control circuit.

An embodiment of the invention provides a battery monitoring device for monitoring states of n (n is an integer greater than or equal to 2) battery cells, the battery monitoring device including: a power transmission circuit having m (m is an integer less than or equal to n) power transmission coils and configured to cause any one of the n power transmission coils to generate an AC magnetic field and wirelessly perform transmission of power and transmission and reception of information; n power reception circuits provided in correspondence with the n battery cells and the m power transmission coils, each of the n power reception circuits having a power reception coil and wirelessly performing reception of power and transmission and reception of information via the power reception coil; and n measurement circuits provided in correspondence with the n power reception circuits and the n battery cells and configured to receive power supplied from the n power reception circuits and measure voltage values of the n battery cells, wherein the power transmission circuit selects any one of the m power transmission coils in accordance with a battery cell of a monitoring target among the n battery cells, causes the selected power transmission coil to generate the AC magnetic field, and receives a result of measuring a voltage value of the battery cell of the monitoring target.

An embodiment of the invention provides a battery monitoring method for use in aforesaid battery monitoring device, the battery monitoring method comprising the steps of: sequentially selecting, by the power transmission circuit, each of the n battery cells as a battery cell of a monitoring target, selecting a corresponding power transmission coil among the m power transmission coils, and causing the power transmission coil to generate the AC magnetic field; receiving a measurement result of a voltage value of the battery cell of the monitoring target from the power reception circuit; calculating an average value of the measurement results of the n battery cells; comparing a number of high-voltage cells having a voltage which is a predetermined allowable value greater than the average value among the n battery cells with a number of low-voltage cells having a low voltage which is the predetermined allowable value less than the average value; and discharging the high-voltage cells if the number of high-voltage cells is greater than the number of low-voltage cells and charging the low-voltage cells if the number of low-voltage cells is greater than the number of high-voltage cells.

BRIEF DESCRIPTION OF THE DRAWINGS

FIG. 7($a$) and FIG. 7($b$) are plan views illustrating another example of the conductor patterns of the power transmission coil and the power reception coil.

FIG. 16($a$) and FIG. 16($b$) are diagrams schematically illustrating an antenna structure of the battery monitoring device.

DESCRIPTION OF THE EMBODIMENTS

The embodiments of the invention provide a signal transmission device and a battery monitoring device capable of performing signal transmission between blocks having a potential difference with a high-reliability and small-scale configuration.

According to the signal transmission device of one or some exemplary embodiments of the invention, signal transmission between blocks having a potential difference can be performed with a high-reliability and small-scale configuration.

Hereinafter, embodiments of the disclosure will be described with reference to the drawings. In the description and the accompanying drawings of the following embodiments, substantially the same or equivalent parts are denoted by the same reference signs.

Embodiment 1

Figure 1:
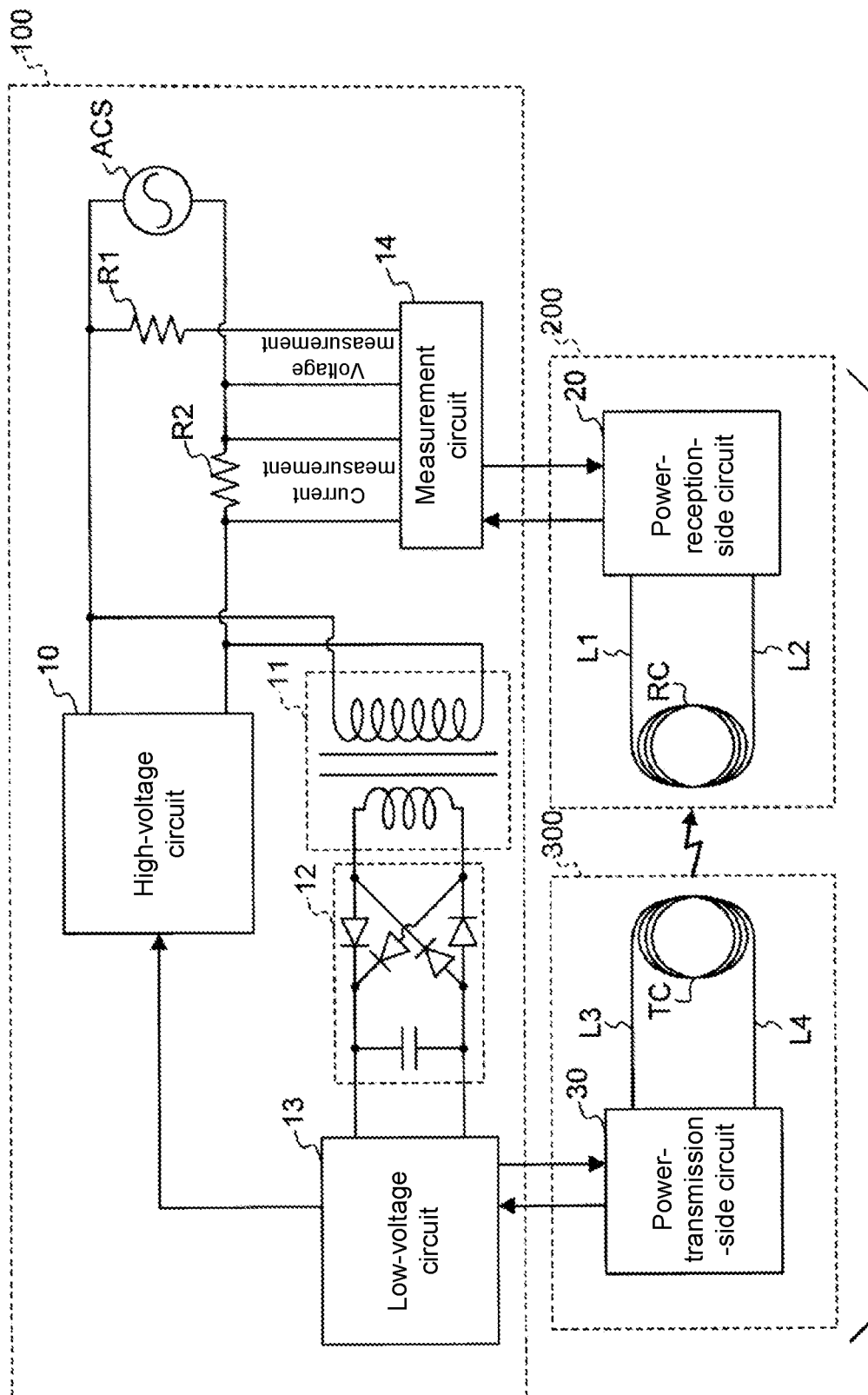
FIG. 1 is a block diagram illustrating a configuration of an operation device including a signal transmission device according to Embodiment 1.

FIG. 1 is a block diagram illustrating an overall configuration of a device including an operation device 100, a power reception circuit 200, and a power transmission circuit 300 according to the present embodiment. The power reception circuit 200 and the power transmission circuit 300 constitute a signal transmission device 400.

The operation device 100 includes a high-voltage circuit 10, a transformer 11, a rectification circuit 12, a low-voltage circuit 13, and a measurement circuit 14.

For example, the high-voltage circuit 10 is a high-voltage operation circuit configured to operate based on an alternating current (AC) voltage which is a high voltage, such as an electric motor, a heating device, an electric furnace, or a chemical reaction layer. The high-voltage circuit 10 operates based on an AC voltage supplied from an AC power supply ACS. The AC power supply ACS is, for example, a power supply for transmitting a commercial AC voltage of AC 100 V.

The transformer 11 is provided in parallel with a voltage supply line connecting the AC power supply ACS and the high-voltage circuit 10, and converts a voltage level of the AC voltage transmitted from the AC power supply ACS, for example, from 100 V to 5 V.

The rectification circuit 12 includes, for example, a diode bridge to which four rectification diodes are connected and a smoothing capacitor. The rectification circuit 12 performs full-wave rectification and smoothing of an AC voltage whose voltage level is converted by the transformer 11 (for example, AC 5 V), and generates a direct current (DC) voltage (for example, DC 5 V). The rectification circuit 12 supplies the generated DC voltage to the low-voltage circuit 13.

The low-voltage circuit 13 includes, for example, a digital circuit or a CPU, and controls the high-voltage circuit 10 and the entire device by supplying a control signal CS. Also, the low-voltage circuit 13 supplies predetermined power V1 to the power transmission circuit 300. The low-voltage circuit 13 performs these operations based on the DC voltage supplied from the rectification circuit 12.

The measurement circuit 14 measures the voltage of the AC power supply ACS divided by a resistor R1 (for example, 100 kΩ). Also, the measurement circuit 14 measures an AC according to a voltage across a resistor R2 (for example, 1Ω) connected to the AC power source ACS. The measurement circuit 14 converts measured voltage and current values according to AD conversion, extracts the converted values as data, and supplies the data as measurement data Md to the power-reception-side circuit 20.

The power reception circuit 200 includes a power reception coil RC and a power-reception-side circuit 20. The power transmission circuit 300 includes a power transmission coil TC and a power-transmission-side circuit 30.

Figure 2:
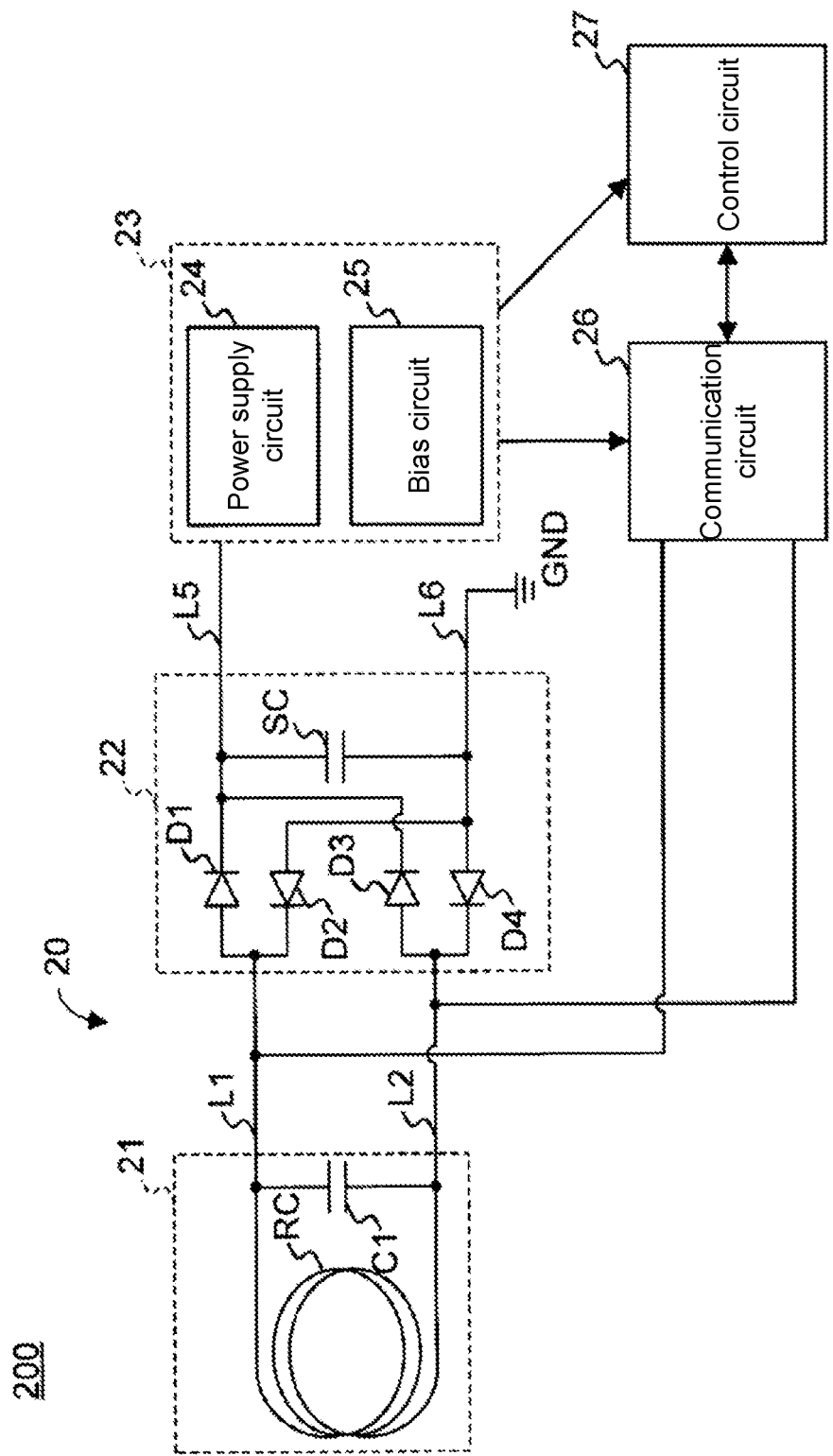
FIG. 2 is a block diagram illustrating a configuration of a power-reception-side circuit.

FIG. 2 is a block diagram illustrating a configuration of the power reception circuit 200.

The power reception coil RC configures a resonance circuit 21 together with a resonance capacitor C1. The power reception coil RC and the resonance capacitor C1 are magnetically coupled to an AC magnetic field of a high frequency (for example, 13.56 MHz) generated by the power transmission coil TC of the power transmission circuit 300, generate an AC voltage (a high-frequency signal) corresponding to the AC magnetic field, and apply the generated AC voltage to lines L1 and L2. Although the resonance circuit 21 is configured as a parallel resonance circuit in which the power reception coil RC and the resonance capacitor C1 are connected in parallel, the resonance circuit 21 may be a series resonance circuit or a combination of a parallel resonance circuit and a series resonance circuit.

The rectification circuit 22 includes a diode bridge to which four rectification diodes D1 to D4 are connected and a smoothing capacitor SC. The rectification circuit 22 performs full-wave rectification and smoothing of the AC voltage (high-frequency power) of the lines L1 and L2, converts the AC voltage into a DC voltage, applies the DC voltage to lines L5 and L6, and supplies the DC voltage to a power supply and bias circuit 23.

The power supply and bias circuit 23 includes a power-supply circuit 24 configured to supply a power-supply voltage to a communication circuit 26 and a control circuit 27 and a bias circuit 25 configured to supply a bias voltage and a bias current to the communication circuit 26 and the control circuit 27.

The communication circuit 26 operates based on the power-supply voltage from the power-supply circuit 24 and the bias voltage and the bias current from the bias circuit 25, and uses the high-frequency signal from the power reception coil RC as a clock to perform bidirectional communication based on amplitude shift keying (ASK) modulation. The communication circuit 26 performs bidirectional communication with the power-transmission-side circuit 30 via the power reception coil RC.

The control circuit 27 operates based on the power-supply voltage from the power-supply circuit 24 and the bias voltage and the bias current from the bias circuit 25 and controls the operation of the entire power-reception-side circuit 20 by exchanging data and the clock with the communication circuit 26.

Figure 3:
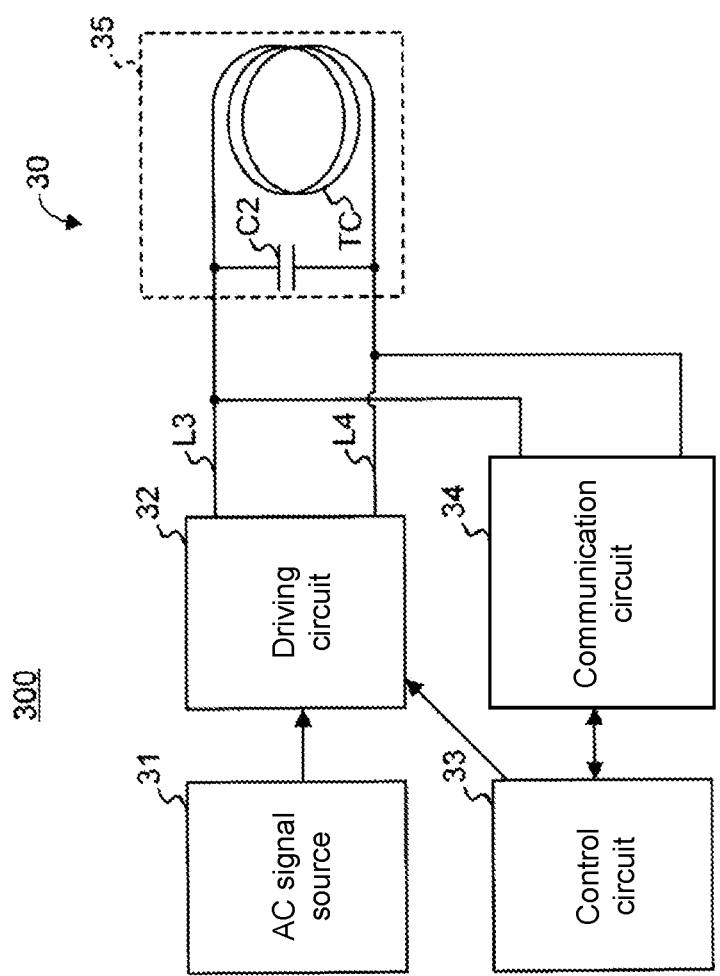
FIG. 3 is a block diagram illustrating a configuration of a power-transmission-side circuit.

FIG. 3 is a block diagram illustrating a configuration of the power transmission circuit 300.

An AC signal source 31 includes a quartz oscillation circuit or the like, generates an AC signal of 13.56 MHz, and supplies the generated AC signal to a driving circuit 32.

The driving circuit 32 amplifies power of the AC signal supplied from the AC signal source 31 to generate a driving current and transmits the generated driving current to lines L3 and L4. Thereby, a high-frequency current flows through the power transmission coil TC.

The control circuit 33 exchanges data and a clock with the communication circuit 34 and controls the operation of the entire power-transmission-side circuit 30.

The communication circuit 34 performs bidirectional communication based on ASK modulation via the power transmission coil TC. Also, the communication circuit 34 may perform communication using a near field communication (NFC) communication method or the like.

The power transmission coil TC forms a resonance circuit 35 together with a resonance capacitor C2. The power transmission coil TC and the resonance capacitor C2 generate an AC magnetic field based on a driving current supplied from the driving circuit 32. Also, although the resonance circuit 35 is configured as a parallel resonance circuit in which the power transmission coil TC and the resonance capacitor C2 are connected in parallel, the resonance circuit 35 may be a series resonance circuit or a combination of a parallel resonance circuit and a series resonance circuit.

In communication based on magnetic-field coupling of the power transmission coil TC and the power reception coil RC, for example, ASK modulation with a modulation index of about 10% is used. Thereby, communication can be performed while power is supplied.

Next, the operation of the signal transmission device 400 of the present embodiment will be described with reference to FIG. 1 again.

First, when the operation device 100 is activated, the low-voltage circuit 13 starts an operation based on a DC voltage of 5 V obtained by converting an AC voltage of AC 100 V from the AC power supply ACS in the transformer 11 and the rectification circuit 12. The low-voltage circuit 13 supplies a control signal CS to cause the high-voltage circuit 10 to be operated. Thereby, the operation device 100 starts an operation. Also, the low-voltage circuit 13 supplies power V1 to the power-transmission-side circuit 30 of the power transmission circuit 300.

The power-transmission-side circuit 30 receives the power V1 from the low-voltage circuit 13 and applies a high-frequency power of 13.56 MHz to the power transmission coil TC to generate a high-frequency AC magnetic field (hereinafter referred to as a high-frequency magnetic field). The power transmission coil TC and the power reception coil RC are magnetic-field coupled according to the generated high-frequency magnetic field and generate high-frequency power according to electromagnetic induction. The power-reception-side circuit 20 is supplied with high-frequency power and a clock of 13.56 MHz via the power reception coil RC.

The power-reception-side circuit 20 supplies a part of the high-frequency power obtained via the power reception coil RC as power V2 to the measurement circuit 14. The measurement circuit 14 measures a voltage and a current of the AC power supply ACS and performs AD conversion to generate measurement data Md. The measurement circuit 14 supplies the measurement data Md to the power-reception-side circuit 20.

The power-reception-side circuit 20 transmits the measurement data Md to the power transmission circuit 300 via the power reception coil RC. The power-transmission-side circuit 30 of the power transmission circuit 300 receives the measurement data Md via the power transmission coil TC.

The power-transmission-side circuit 30 supplies the measurement data Md to the low-voltage circuit 13. The low-voltage circuit 13 makes various types of determinations based on the measurement data Md and controls the high-voltage circuit 10.

As described above, in the signal transmission device 400 of the present embodiment, the exchange of the measurement data Md and the power supply to the measurement circuit 14 are performed using the high-frequency magnetic field of 13.56 MHz according to the magnetic-field coupling between the power transmission coil TC and the power reception coil RC.

According to the signal transmission device 400 of the present embodiment, signal transmission can be performed according to the magnetic-field coupling between the power transmission coil TC and the power reception coil RC, so that electrical isolation can be easily implemented. Therefore, it is possible not to use expensive and large-size parts such as a photocoupler or a transformer.

Also, because it is possible to supply power to the measurement circuit 14 according to the magnetic-field coupling between the power transmission coil TC and the power reception coil RC, a sensor circuit, an operational amplifier circuit for signal processing, an AD converter circuit, and a digital circuit for arithmetic processing can be arranged as the measurement circuit 14. Accordingly, it is possible to implement a high-performance and high-efficiency device capable of performing advanced measurement and data processing, compression of communication data, and the like.

Also, the power transmission coil TC and the power reception coil RC can be shielded from the outside world by a magnetic sheet or the like, and it is possible to easily prevent external interference and information leakage.

Also, because the power transmission coil TC and the power reception coil RC are detachable and can be operated while they mutually rotate or their positions change, it is possible to eliminate electrical contact points and create inexpensive and highly reliable signal connection points.

Also, because the power transmission coil TC and the power reception coil RC can be operated even in a state in which they are immersed in water, they can also be used for exchanging measurement data in the sea or underwater.

Also, power supply to the measurement circuit 14 or the like according to the magnetic field may be simultaneously performed in parallel with the communication operation according to magnetic-field coupling or may be performed according to a non-modulated high-frequency magnetic field in which no communication is performed.

Next, the configurations of the power transmission coil TC and the power reception coil RC will be described with reference to FIGS. 4(a) and 4(b).

The power transmission coil TC and the power reception coil RC are formed by forming a conductor pattern of the power transmission coil in a first wiring layer from the first wiring layer and a second wiring layer provided on both surfaces of a substrate of an isolation material (for example, a substrate material FR-4 with a thickness of 1.6 mm), forming a conductor pattern of the power reception coil in the second wiring layer, and providing wiring in a via connected between the first wiring layer and the second wiring layer.

Figure 4:
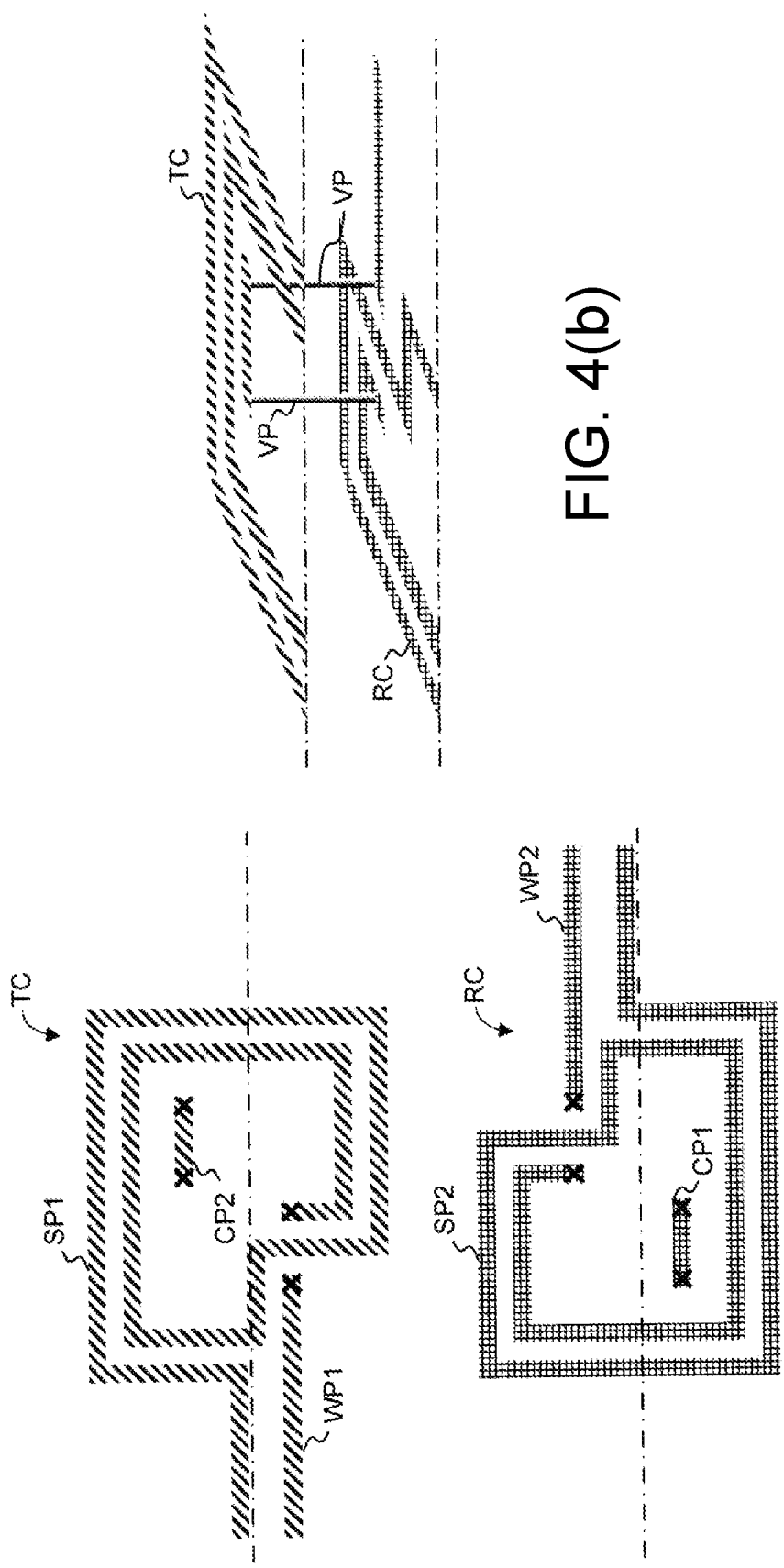
FIG. 4($a$) is a plan view and FIG. 4($b$) is a cross-sectional perspective view (b) of conductor patterns of a power transmission coil and a power reception coil.

FIG. 4(a) is a plan view when the conductor pattern of the power transmission coil TC is viewed from the first wiring layer side of the substrate in a top view and is a plan view when the conductor pattern of the power reception coil RC is viewed from the second wiring layer side of the substrate in a top view. FIG. 4(b) is a cross-sectional perspective view of the power transmission coil TC and the power reception coil RC in a broken line part of FIG. 4(a).

The power transmission coil TC and the power reception coil RC have conductor patterns in which conductor wires made of copper foil, for example, having a thickness of 35 µm, are formed in a spiral shape of two or more turns (more than one turn). An end of the conductor pattern of the power transmission coil TC is connected to the power-transmission-side circuit 30. An end of the conductor pattern of the power reception coil RC is connected to the power-reception-side circuit 20.

As illustrated in FIG. 4(a), the power transmission coil TC has a wiring part WP1 including a continuous conductor wire having one end connected to a resonance capacitor C2 (not illustrated) constituting a resonance circuit, and a spiral part SP1 including a continuous conductor wire of a spiral shape having a first end connected to the resonance capacitor C2. The spiral part SP1 has a conductor wire part that crosses a space between a second end of the spiral part SP1 and the other end of the wiring part WP1 (indicated by a mark x in FIG. 4(a)).

Also, the power transmission coil TC has a connection part configured to connect the second end of the spiral part SP1 and the other end of the wiring part WP1. The connection part includes a continuous conductor wire part CP1 provided in the second wiring layer and a via wiring part VP passing through a pair of vias provided between the first wiring layer and the second wiring layer. That is, a crossing of wiring of the power transmission coil TC is implemented by the conductor wire part CP1 and the via wiring part VP.

The power reception coil RC has a wiring part WP2 including a continuous conductor wire having one end connected to a resonance capacitor C1 (not illustrated) constituting a resonance circuit and a spiral part SP2 including a continuous conductor wire of a spiral shape having a first end connected to the resonance capacitor C1. The spiral part SP2 has a conductor wire part that crosses a space between the second end of the spiral part SP2 and the other end of the wiring part WP2 (indicated by a mark x in FIG. 4(a)).

Also, the power reception coil RC has a connection part configured to connect the second end of the spiral part SP2 and the other end of the wiring part WP2. The connection part includes a continuous conductor wire part CP2 provided in the first wiring layer as illustrated in FIG. 4(a) and a via wiring part VP passing through a pair of vias provided between the first wiring layer and the second wiring layer as illustrated in FIG. 4(b). That is, a crossing of wiring of the power reception coil RC is implemented by the conductor wire part CP2 and the via wiring part VP.

The conductor wire part CP1 of the connection part of the power transmission coil TC is provided at a position (i.e., an isolated position) separated from the spiral part SP2 of the power reception coil RC in the second wiring layer. Likewise, the conductor wire part CP2 of the connection part of the power reception coil RC is provided at a position (i.e., an isolated position) separated from the spiral part SP1 of the power transmission coil TC in the first wiring layer.

Also, the conductor wire part CP1 of the connection part of the power transmission coil TC is arranged inside an inner diameter of the spiral part SP2 of the power reception coil RC in the second wiring layer. The conductor wire part CP2 of the connection part of the power reception coil RC is arranged inside an inner diameter of the spiral part SP1 of the power transmission coil TC in the first wiring layer.

The spiral part SP1 of the power transmission coil TC and the spiral part SP2 of the power reception coil RC are arranged so that they overlap via the first wiring layer, the substrate, and the second wiring layer, except for a part where the conductor wire part CP1 and the conductor wire part CP2 are positioned.

The power transmission coil TC and the power reception coil RC are coils configured to handle a high-frequency magnetic field of 13.56 MHz and have an inductance of about 0.5 to 1 microhenry, for example. This is because the reactance of the coil is about 42.6 to 85.2Ω, which is suitable for handling the reactance at a power-supply voltage of about 5 V frequently used in electronic devices. On the other hand, an outer diameter size of the coil is, for example, about 20 mm due to the circumstances of a device size. In order to satisfy these conditions, a coil is formed in a spiral shape of two or more turns (the number of turns which is greater than one), and the coil has a crossing with isolation.

In the power transmission coil TC and the power reception coil RC according to the present embodiment, a crossing is implemented with isolation according to the conductor wire parts (CP1 and CP2) provided in the wiring layer opposite to the spiral parts (SP1 and SP2) and the via wiring parts (VP) provided in the pair of vias. According to this configuration, it is possible to implement a crossing with isolation in an inexpensive two-layer printed substrate without using a substrate of a large number of layers such as four layers.

Also, although slight disturbance occurs in a region where each coil crosses over (hereinafter referred to as a crossing region), an influence on operations and characteristics is sufficiently small due to a slight change in self-inductance of each coil and a coefficient of coupling between the two coils.

Also, it is possible to secure amounts of isolation resistance of the power transmission coil TC and the power reception coil RC by setting a thickness of an isolation substrate sandwiched between front and rear conductors, a distance in a planar direction between the conductor pattern (the spiral part SP1 and the wiring part WP1) of the power transmission coil TC in the first wiring layer and the conductor pattern (the conductor wire part CP2) of the power reception coil RC, and a distance in a planar direction between the conductor pattern (the spiral part SP2 and the wiring part WP2) of the power reception coil RC in the second wiring layer and the conductor pattern (the conductor wire part CP1) of the power transmission coil TC to safe sizes. At this time, it is possible to widen an interval between the conductor pattern of the power transmission coil TC and the conductor pattern of the power reception coil RC of each layer in accordance with a desired isolation distance.

Also, because crossing regions (the conductor wire parts CP2 and CP1) are provided inside the inner diameters of the spiral parts (SP1 and SP2), a compact device can be implemented without increasing an occupied area.

Figure 5:
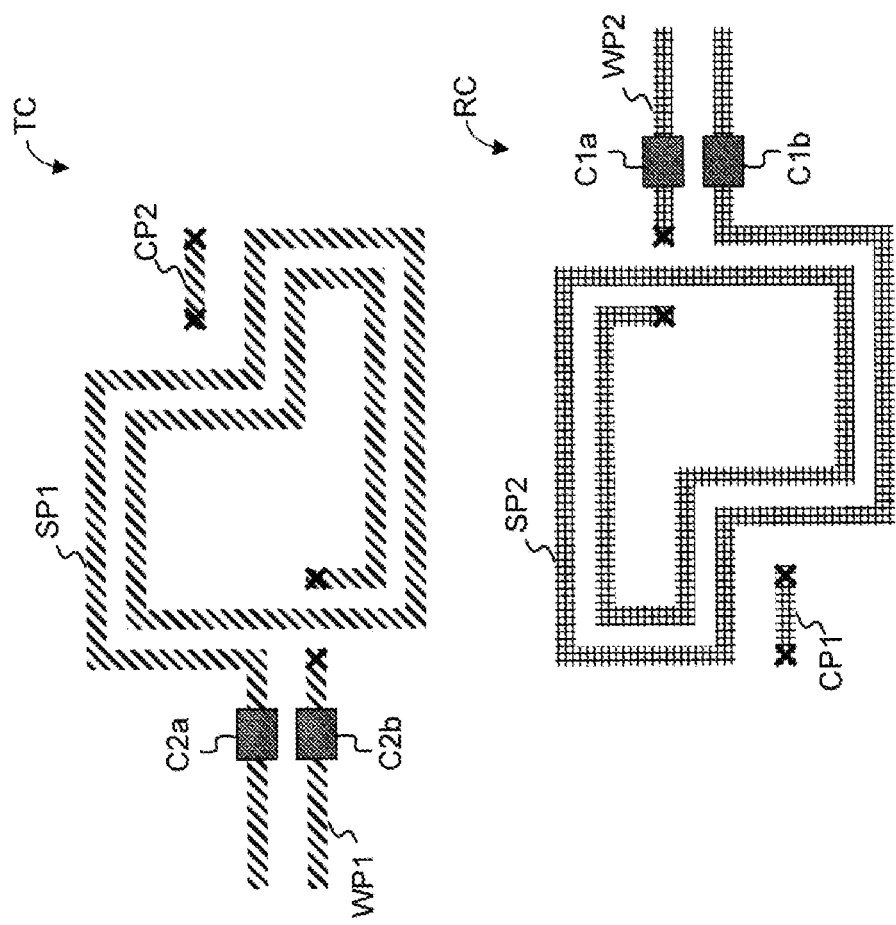
FIG. 5 is a plan view illustrating a positional relationship between the conductor patterns of the power transmission coil and the power reception coil and the resonance capacitor.

FIG. 5 is a plan view illustrating a positional relationship between the conductor patterns of the power transmission coil TC and the power reception coil RC and the resonance capacitors C1 and C2.

On a connection line (a straight line part in which the wiring part WP1 and the spiral part SP1 run in parallel in FIG. 5) associated with the resonance capacitor C2 of the wiring part WP1 and the spiral part SP1, land patterns C2a and C2b for making a soldering connection of the resonance capacitor C2 are provided. The land patterns C2a and C2b are provided at intervals within three times the wiring interval of the coil part of the power transmission coil TC.

Likewise, on a connection line (a straight line part in which the wiring part WP2 and the spiral part SP2 run in parallel in FIG. 5) associated with the resonance capacitor C1 of the wiring part WP2 and the spiral part SP2, land patterns C1a and C1b for making a soldering connection of the resonance capacitors C1 are provided. The land patterns C1a and C1b are provided at intervals within three times the wiring interval of the coil part of the power reception coil RC.

As an interlayer length of the conductor pattern of the power transmission coil TC and the power reception coil RC increases, the number of magnetic flux lines interlinked with each other can increase and the coupling coefficient can increase. In a path between each coil and each resonance capacitor, a large current flows during resonance. By arranging the capacitor at a near position, it is possible to reduce the number of self-interlink magnetic flux lines and prevent the coupling coefficient from decreasing.

Figure 6:
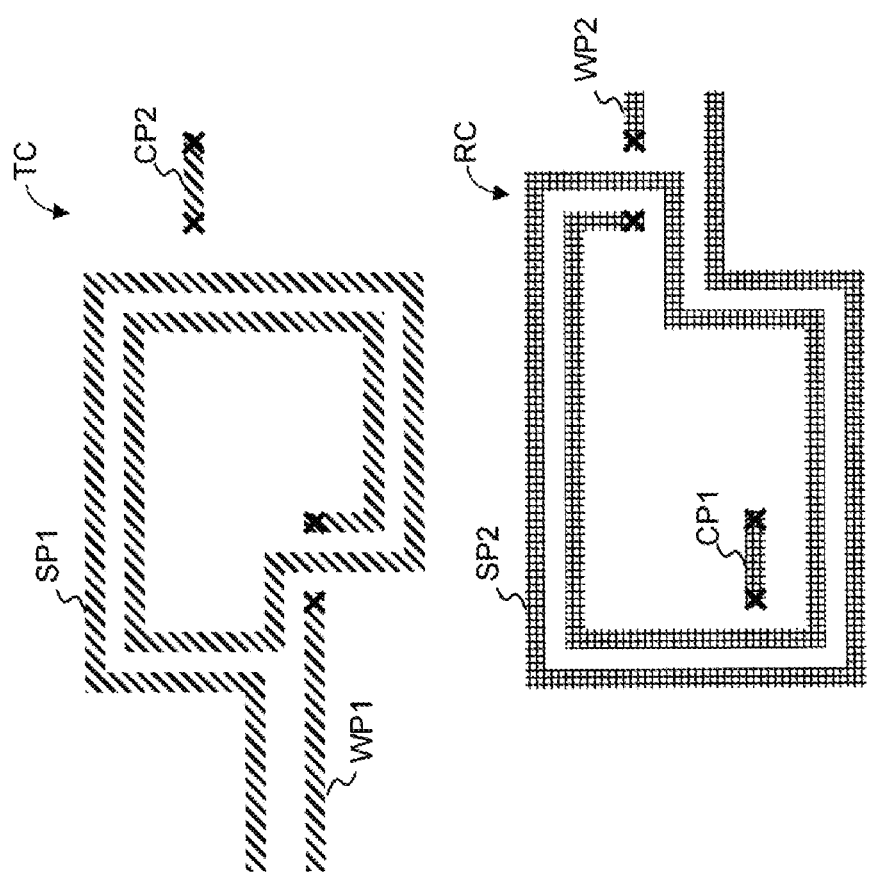
FIG. 6 is a plan view illustrating another example of the conductor patterns of the power transmission coil and the power reception coil.

Also, unlike the above, as illustrated in FIG. 6, one of the crossing regions may be arranged inside an inner diameter of the coil (that is, inside the spiral part) and the other may be arranged outside an outer diameter of the coil (that is, outside the spiral part). For example, when it is necessary to increase a distance in a planar direction for securing isolation on either side of a printed substrate, the crossing region is arranged outside the outer diameter of the coil, so that it is possible to minimize an increase in an occupied area while increasing the isolation distance compared with the case where the crossing region is arranged inside the inner diameter of the coil.

Also, as illustrated in FIGS. 7(a) and 7(b), both the crossing regions may be arranged on an outer side of an outer diameter of the coil. When it is necessary to increase the distance in the planar direction for securing isolation on both sides of the printed substrate, the crossing region is arranged outside the outer diameter of the coil, so that it is possible to minimize an increase in an occupied area while increasing the isolation distance compared with the case where the crossing region is arranged inside the inner diameter of the coil.

Also, the power reception coil RC may be formed in the first wiring layer and the power transmission coil TC may be formed in the second wiring layer.

Although an example in which the power transmission coil TC and the power reception coil RC have rectangular shapes is illustrated in FIGS. 4(a) and 4(b) and FIGS. 5, 6, 7(a), and 7(b), a bent part may be a curve or a square, a circle, an ellipse, a polygon or the like.

Also, although a conductor layer is formed of two layers of the first wiring layer and the second wiring layer, a plurality of conductor layers of a multilayer substrate having two or more layers may be used. For example, it is possible to isolate the surface of each coil by using two middle wiring layers from four conductor layers as wiring layers.

Embodiment 2

Figure 8:
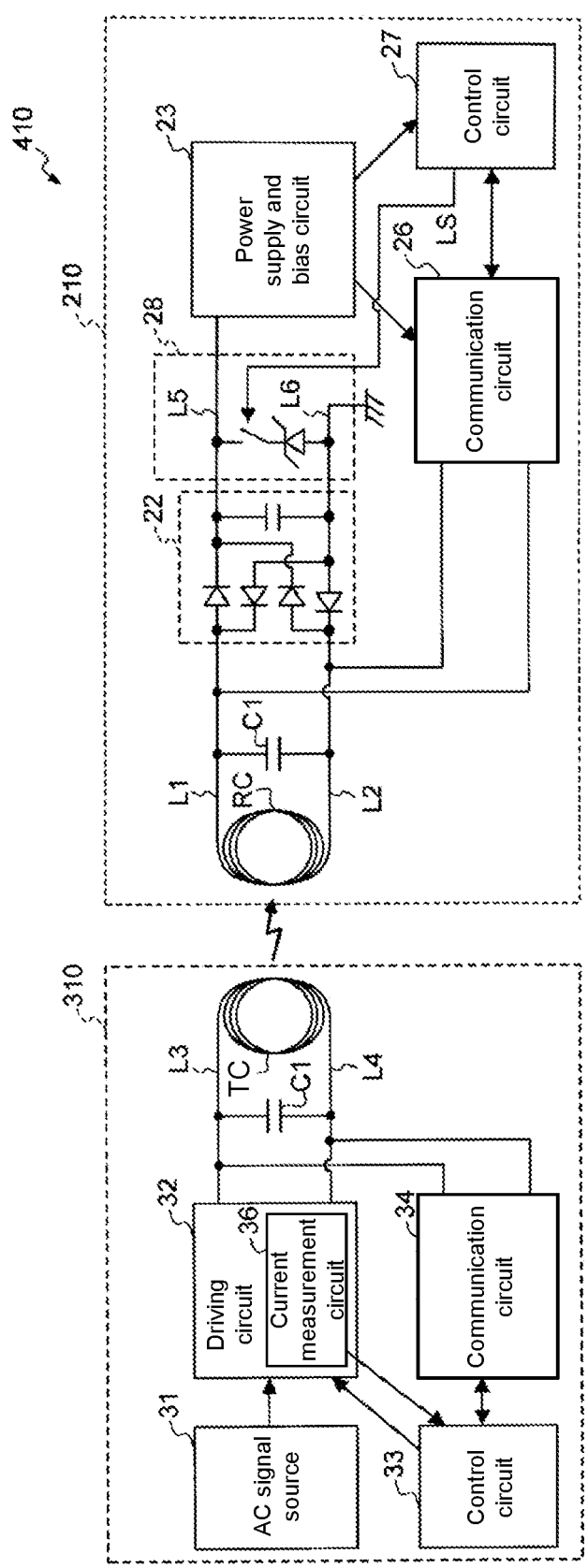
FIG. 8 is a block diagram illustrating a configuration of a signal transmission device according to Embodiment 2.

FIG. 8 is a block diagram illustrating a configuration of a signal transmission device 410 of the present embodiment. The signal transmission device 410 is different from the signal transmission device 400 of the first embodiment in that a power reception circuit 210 has a clamp circuit 28 and a power transmission circuit 310 has a current measurement circuit 36.

The clamp circuit 28 is provided on an output side of a rectification circuit 22 between lines L5 and L6. The clamp circuit 28 includes a Zener diode and a connection switch. The clamp circuit 28 switches a state of the connection switch to an ON or OFF state in accordance with the supply of a load switching signal LS from a control circuit 27. Thereby, the load state of the rectification circuit 22 changes and the state of the high-frequency magnetic field changes. That is, the clamp circuit 28 is a load switching circuit configured to switch the load state in accordance with the load switching signal.

The current measurement circuit 36 is provided in a driving circuit 32. The current measurement circuit 36 detects a change in a high-frequency magnetic field based on currents flowing through lines L3 and L4 and notifies a control circuit 33 of a detection result.

Figure 9:
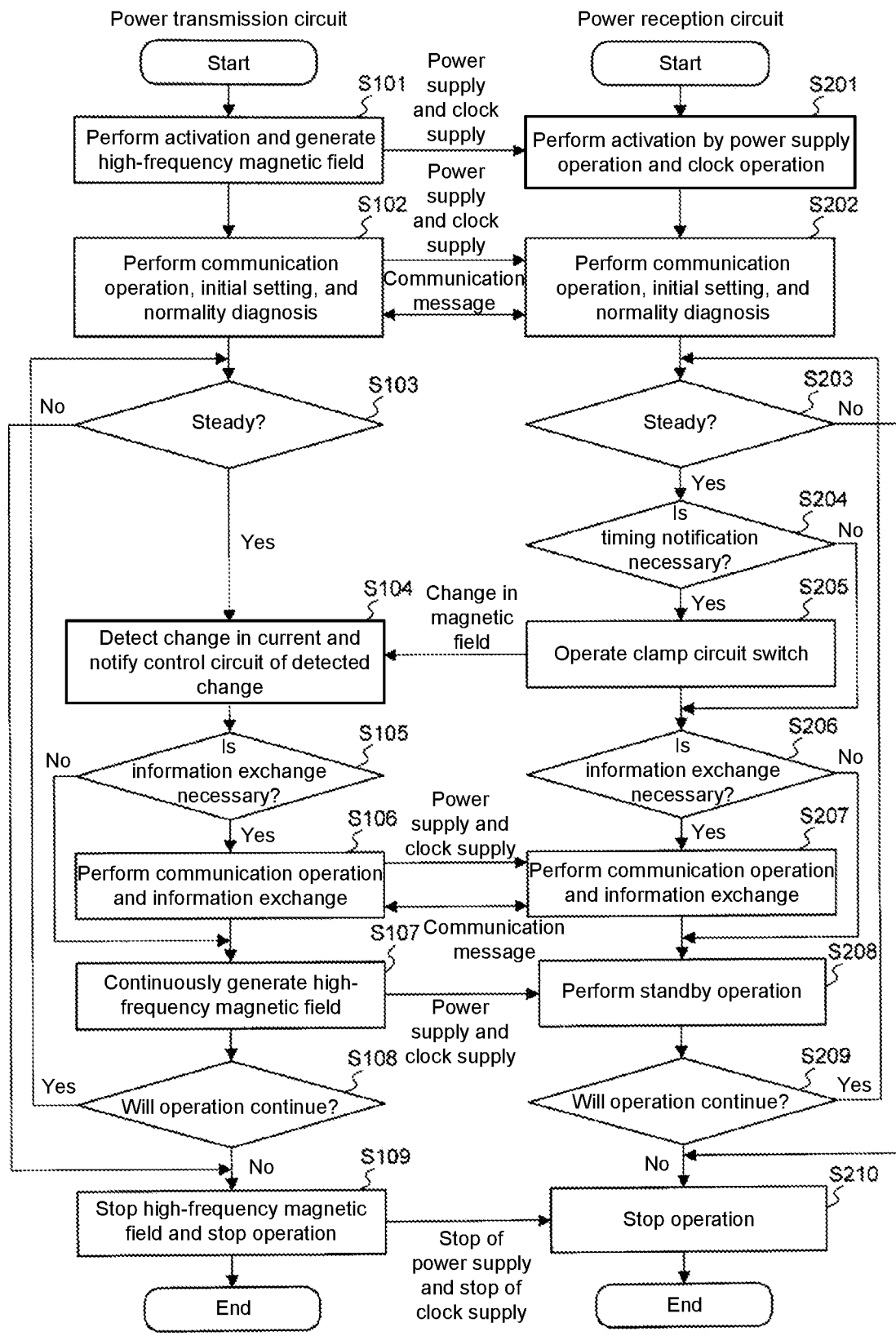
FIG. 9 is a flowchart illustrating operations of a power transmission circuit and a power reception circuit including a timing notification operation.

According to operations of the clamp circuit 28 and the current measurement circuit 36, it is possible to provide a notification from the power reception circuit 210 to the power transmission circuit 310. Operations of the power transmission circuit and the power reception circuit including a timing notification operation will be described with reference to the flowchart of FIG. 9.

First, the power transmission circuit 310 is activated to cause a power transmission coil TC to generate a high-frequency magnetic field (step S101). The power transmission circuit 310 supplies power and a clock to the power reception circuit 210. The power reception circuit 210 is activated in accordance with power supply and clock supply (step S201).

The power transmission circuit 310 and the power reception circuit 210 transmit and receive a communication message according to bidirectional communication via magnetic-field coupling between the power transmission coil TC and a power reception coil RC. The power transmission circuit 310 continues power supply and clock supply in parallel with the transmission and reception of the communication message. Each of the power transmission circuit 310 and the power reception circuit 210 performs initial setting based on setting information obtained according to the transmission and reception of the communication message and performs normality diagnosis to diagnose whether or not the operation is performed normally (steps S102 and S202).

The control circuit 27 of the power reception circuit 210 determines whether or not a high-frequency magnetic field is in a steady state (step S203). If it is determined that the high-frequency magnetic field is not in the steady state (step S203: No), the process proceeds to step S210 and the operation is stopped.

On the other hand, when it is determined that the high-frequency magnetic field is in the steady state (step S203: Yes), the control circuit 27 determines whether or not a timing notification is necessary (step S204).

When it is determined that the timing notification is necessary (step S204: Yes), the control circuit 27 controls the clamp circuit 28 to perform switching between ON and OFF states (step S205). Thereby, the high-frequency magnetic field changes.

The control circuit 33 of the power transmission circuit 310 determines whether or not the high-frequency magnetic field is in the steady state (step S103). If it is determined that the high-frequency magnetic field is not in the steady state (step S103: No), the process proceeds to step S109 and the high-frequency magnetic field and the operation of the device are stopped.

On the other hand, when it is determined that the high-frequency magnetic field is in the steady state (step S103: Yes), the current measurement circuit 36 detects a change in a current due to a change in the high-frequency magnetic field and notifies the control circuit 33 of a detection result (step S104).

The control circuit 33 of the power transmission circuit 310 determines whether or not information exchange (communication) with the power reception circuit 210 is necessary (step S105). Likewise, the control circuit 27 of the power reception circuit 210 determines whether or not information exchange (communication) with the power transmission circuit 310 is necessary (step S206).

When it is determined that information exchange with the power reception circuit 210 is necessary (steps S105 and S206: Yes), the power transmission circuit 310 and the power reception circuit 210 perform a communication operation according to magnetic-field coupling between the power transmission coil TC and the power reception coil RC, and exchange information including a communication message with the power reception circuit 210 (steps S106 and S207). The power transmission circuit 310 supplies power and a clock to the power reception circuit 210 in parallel with the communication operation.

When it is determined that information exchange with the power transmission circuit 310 is unnecessary (step S206: No), the power reception circuit 210 performs a standby operation (step S208). When it is determined that information exchange with the power reception circuit 210 is unnecessary (step S105: No), the power transmission circuit 310 continuously generates the high-frequency magnetic field from the power transmission coil TC (step S107).

The control circuit 33 of the power transmission circuit 310 determines whether or not to continue the power supply and clock supply operation based on the high-frequency magnetic field (step S108). Likewise, the control circuit 27 of the power reception circuit 210 determines whether or not to continue the standby operation for receiving the power supply and the clock supply (step S209).

When it is determined that the power supply and clock supply operation based on the high-frequency magnetic field will be continued (step S108: Yes), the control circuit 33 of the power transmission circuit 310 returns to step S103 and determines whether or not the high-frequency magnetic field is in the steady state again. Likewise, when it is determined that the standby operation for receiving the power supply and the clock supply will be continued (step S209: Yes), the control circuit 27 of the power reception circuit 210 returns to step S203 and determines whether or not the high-frequency magnetic field is in the steady state again.

When it is determined that the power supply and clock supply operation based on the high-frequency magnetic field will not be continued (step S108: No), the power transmission circuit 310 stops the high-frequency magnetic field and stops the operation (step S109). When it is determined that the standby operation for receiving the power supply and the clock supply will not be continued (step S209: No), the power reception circuit 210 stops the operation (step S210).

A notification is provided from the power reception circuit 210 to the power transmission circuit 310 at any timing according to the above operation.

In the signal transmission device 410 of the present embodiment, according to the operations of the clamp circuit 28 and the current measurement circuit 36, a notification can be provided from the power reception circuit 210 to the power transmission circuit 310 at any timing in addition to communication based on the magnetic-field coupling between the power transmission coil TC and the power reception coil RC. At this time, by securing a voltage of the clamp circuit 28 at a voltage (for example, 3 V) at which the power supply and bias circuit 23 can operate, it is possible to perform a communication operation using the power transmission coil TC and the power reception coil RC in parallel while providing the notification from the power reception circuit 210 to the power transmission circuit 310.

For example, the signal transmission device of the present embodiment is particularly effective when accuracy in time is required for a gate control timing of a transistor or a thyristor of the high-voltage circuit 10.

Embodiment 3

Figure 10:
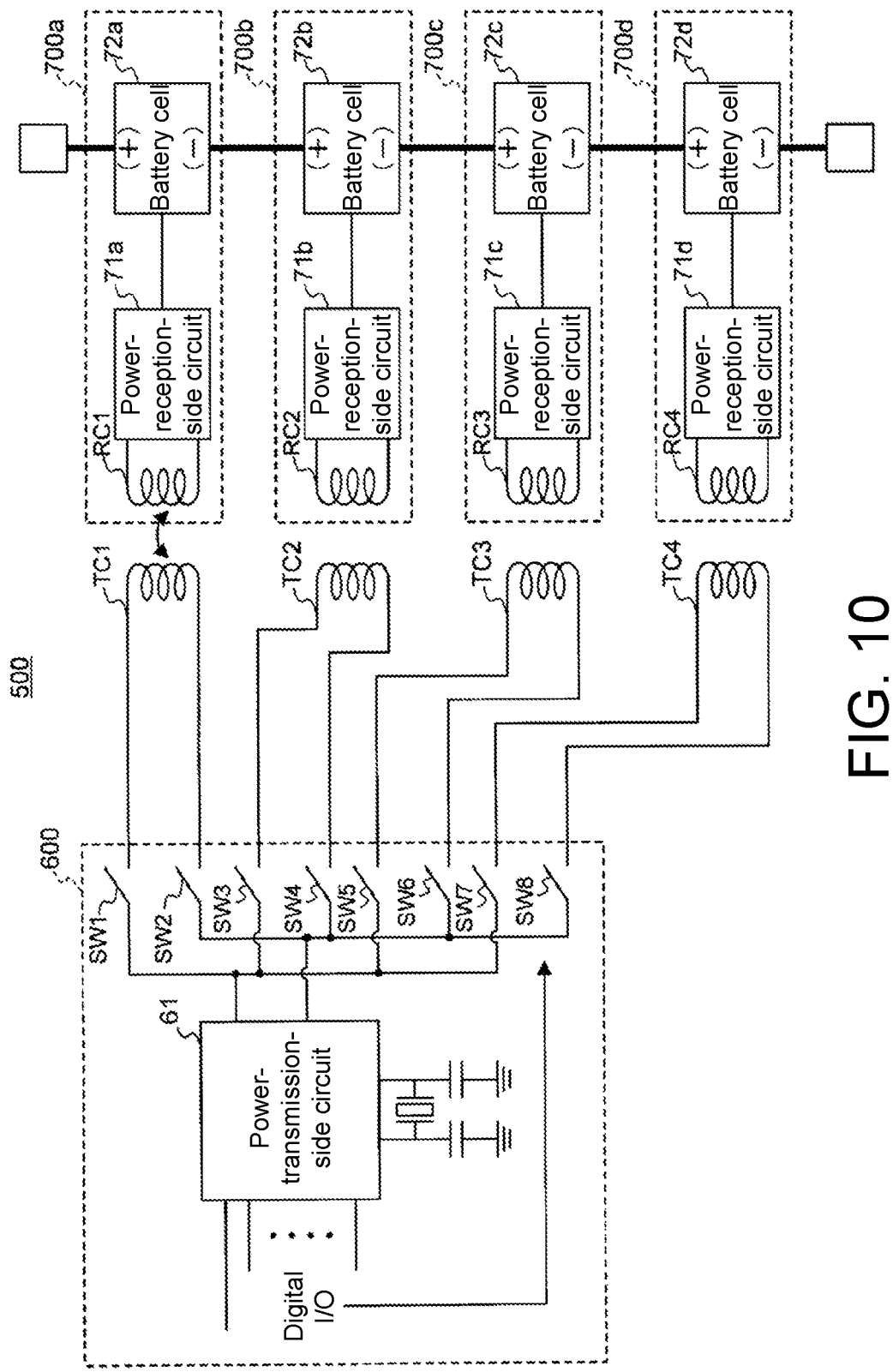
FIG. 10 is a block diagram illustrating a configuration of a battery monitoring device according to Embodiment 3.

FIG. 10 is a block diagram illustrating a configuration of a battery monitoring device 500 of this embodiment. The battery monitoring device 500 is provided in a device powered by a battery, for example, such as an electric car or the like, and is a device configured to monitor states of charge of four battery cells 72a to 72d (hereinafter also collectively referred to as a battery cell group) connected in series.

A power-reception-side circuit 71a is connected to the battery cell 72a. A power reception coil RC1 is connected to the power-reception-side circuit 71a. The power reception coil RC1, the power-reception-side circuit 71a, and the battery cell 72a constitute a power reception circuit 700a. Likewise, power reception circuits 700b to 700d are configured by providing corresponding power-reception-side circuits (71b to 71d) and power reception coils (RC2 to RC4) in the battery cells 72b to 72d. When a configuration common to the power reception circuits 700a to 700d is described in the following description, these are also referred to as a power reception circuit 700.

Figure 11:
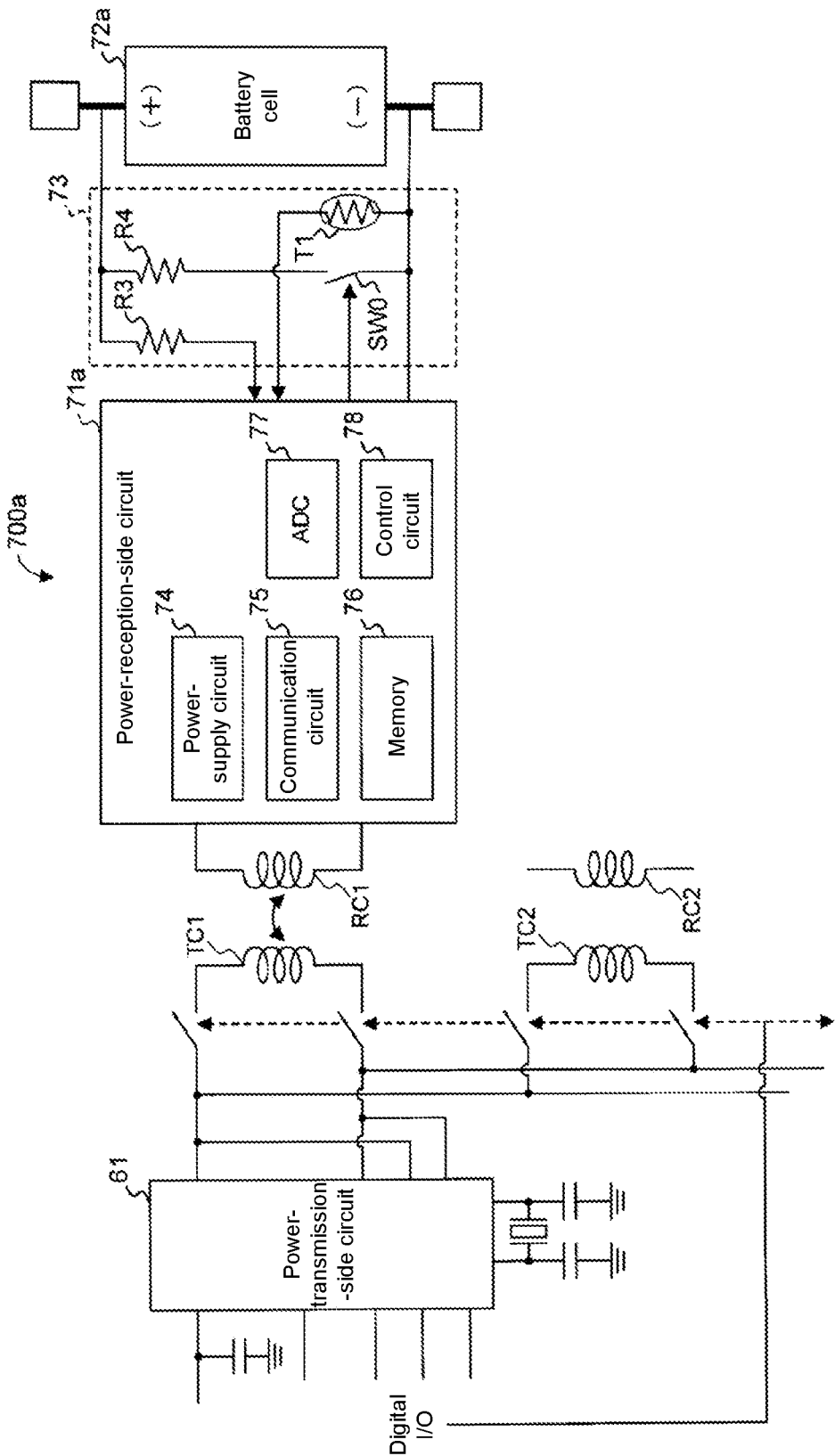
FIG. 11 is a block diagram illustrating details of a power reception block including a power-reception-side circuit.

FIG. 11 is a block diagram illustrating details of the power reception circuit 700a including the power-reception-side circuit 71a. Between the power-reception-side circuit 71a and the battery cell 72a, a measurement circuit 73 for measuring a voltage value and temperature of the battery cell 72a is provided. Also, the power reception circuits 700b to 700d also have similar configurations.

The measurement circuit 73 measures a voltage of the battery cell 72a through an operation of dividing the voltage by a resistor R3. Also, the measurement circuit 73 measures the temperature of the battery cell 72a through a thermistor T 1. Also, the measurement circuit 73 has a switch SW0 and a resistor R4 for forcibly discharging the battery cell 72a, and discharges the battery cell 72a by turning on the switch SW0 in accordance with control of the power-reception-side circuit 71a.

The power-reception-side circuit 71a includes a power-supply circuit 74, a communication circuit 75, a memory 76, an analog to digital converter (ADC) 77, and a control circuit 78.

The power-supply circuit 74 supplies a power-supply voltage to each part of the power-reception-side circuit 71a based on power supplied according to magnetic-field coupling between a power transmission coil TC1 and a power reception coil RC1.

The communication circuit 75 transmits and receives information based on ASK modulation via the power reception coil RC1. For example, the communication circuit 75 transmits monitoring data obtained by the measurement circuit 73 to a power-transmission-side circuit 61 via the power reception coil RC1.

The memory 76 is a nonvolatile memory and stores serial numbers, history information, or the like of the battery cells 72a in addition to control information (for example, an ID of NFC communication) for communication and address information.

The ADC 77 converts the voltage value and the temperature measured by the measurement circuit 73 according to AD conversion to generate monitoring data.

The control circuit 78 controls each part of the power-reception-side circuit 71a. Also, the control circuit 78 controls forced discharging of the battery cell via the resistor R4 and the switch SW0.

Referring again to FIG. 10, the battery monitoring device 500 has a power transmission circuit 600 and power transmission coils TC1 to TC4 connected thereto. The power transmission coils TC1 to TC4 are provided at positions corresponding to the power reception coils RC1 to RC4 (that is, positions at which magnetic-field coupling is performed).

The power transmission circuit 600 has the power-transmission-side circuit 61 and switches SW1 to SW8.

The power-transmission-side circuit 61 controls ON/OFF of the switches SW1 to SW8 to select any one of the four power transmission coils TC1 to TC4, transmits a high-frequency signal of 13.56 MHz, and causes the selected power transmission coil to generate a high-frequency magnetic field. A high-frequency electromotive force is generated by electromagnetic induction in the power reception coil (any one of RC1 to RC4) coupled to the selected power transmission coil.

The power-transmission-side circuit 61 supplies power and a clock to the power-reception-side circuit (any one of 71a to 71d) connected to the power reception coil where the high-frequency electromotive force is generated to operate the power-reception-side circuit, and transmits and receives the control information and monitoring data according to a bidirectional communication function. The power-transmission-side circuit 61 receives a digital signal input/output (indicated as a digital I/O in FIG. 11) from a host control device (not illustrated) and performs an operation.

Figure 12:
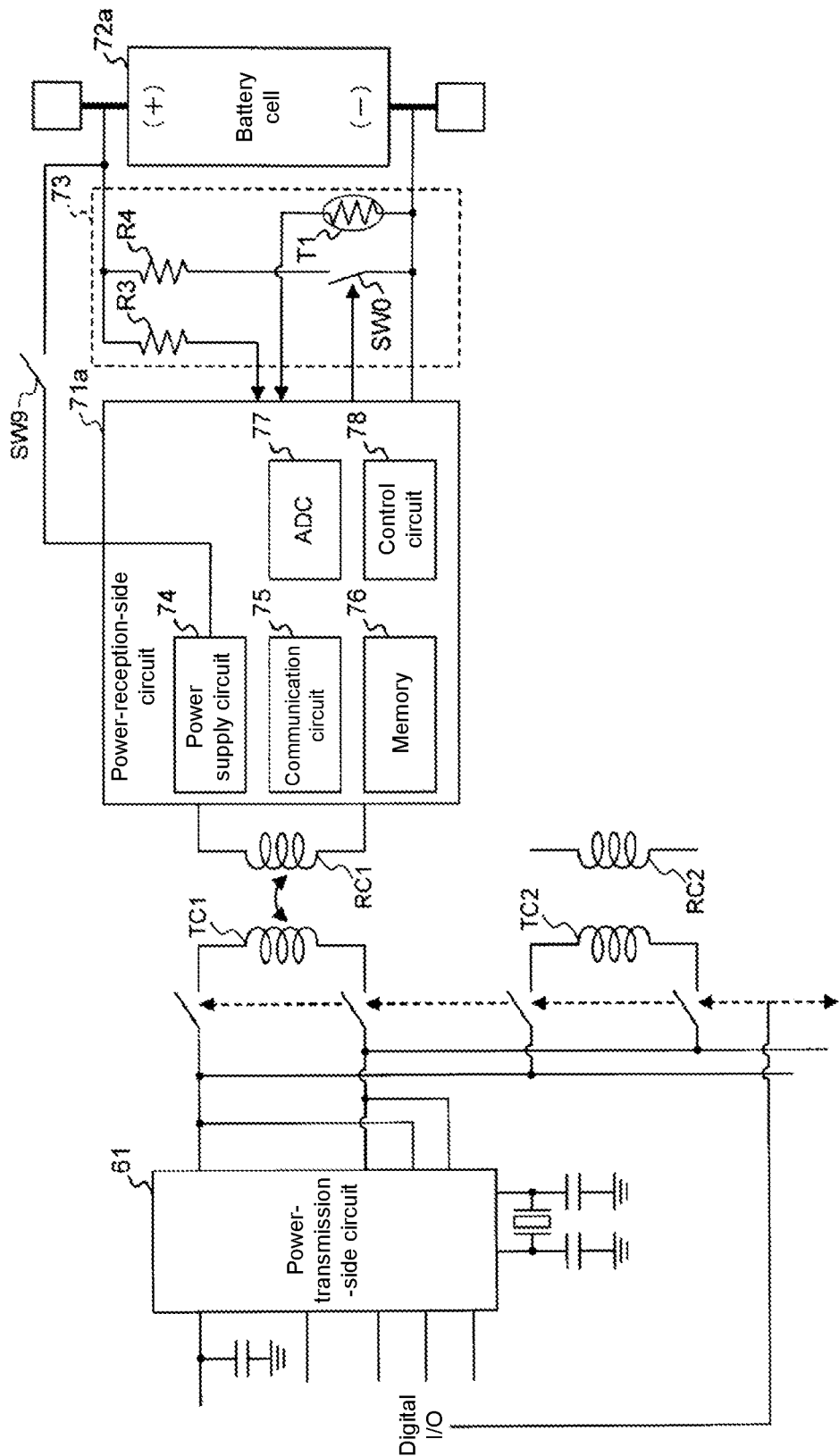
FIG. 12 is a block diagram illustrating another configuration example of the battery monitoring device.

FIG. 12 is a block diagram illustrating another configuration example of the battery monitoring device of the present embodiment. A power-supply line from the power-supply circuit 74 of the power-reception-side circuit 71a is connected to the battery cell 72a via a switch SW9. The switch SW9 is switched between ON and OFF by the control circuit 78.

The control circuit 78 controls the switch SW9 so that the switch SW9 is turned on and sets the voltage and current of the power-supply circuit 74. Thereby, the power-receptionside circuit 71a can charge the battery cell with power obtained from the high-frequency magnetic field.

As illustrated in FIG. 10, if a plurality of battery cells are connected in series, it is necessary to align the state of charge of each battery cell. Conventionally, when it is determined that the state of charge varies according to voltage measurement, the state of charge is aligned by causing a cell with a high voltage to be forcibly discharged. Thus, for example, if only the voltage of one battery cell is low, all other battery cells must be discharged, consumption of energy is caused and an extra time is required for a related countermeasure.

However, according to this configuration, it is possible to additionally charge a cell with a low voltage. Accordingly, it is possible to align a state of charge of each battery cell without wasting energy or a time by discharging cells having a high voltage when the number of cells having the high voltage is small and charging cells having a low voltage when the number of cells having the low voltage is small in accordance with a state of voltage variation.

Figure 13:
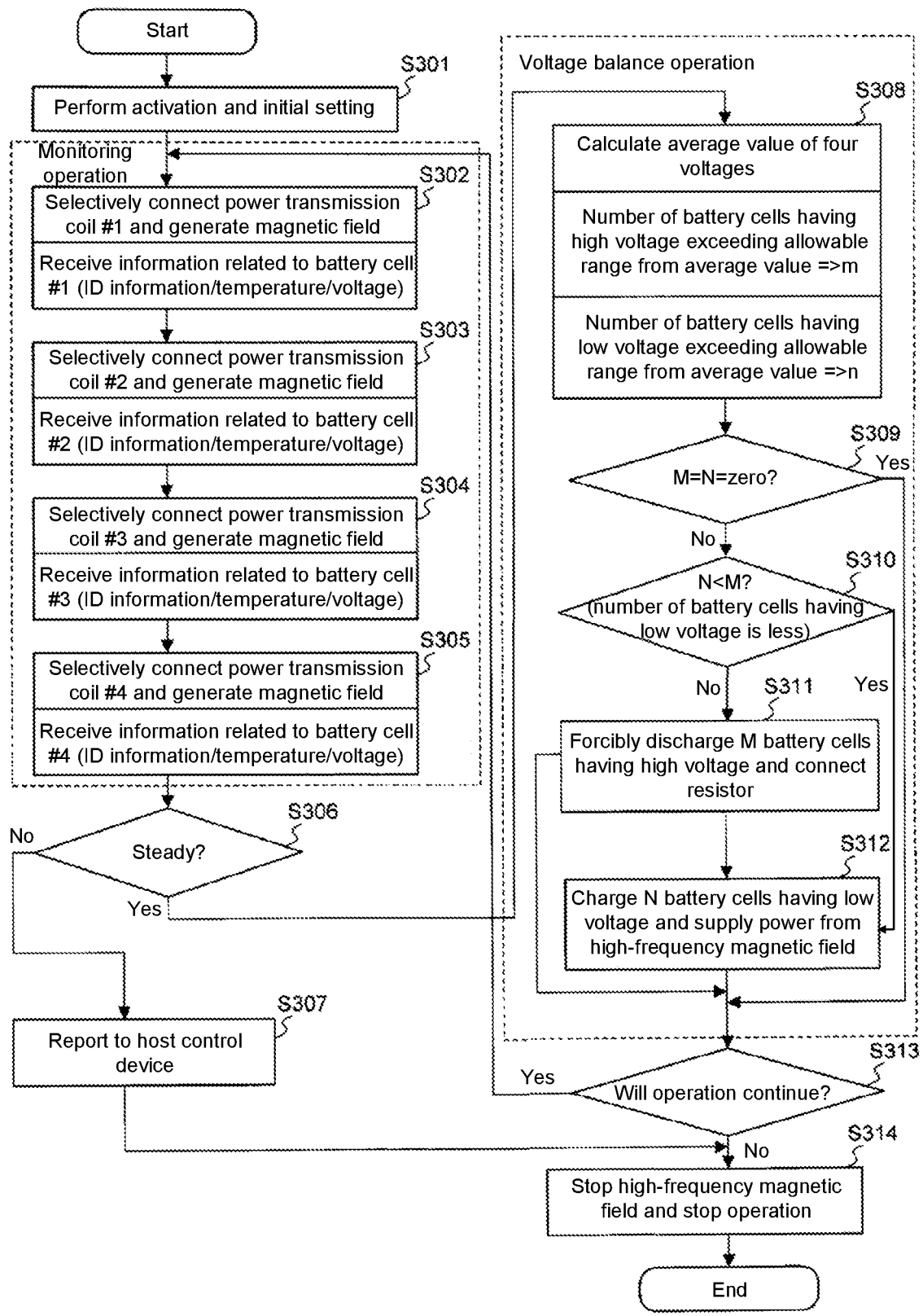
FIG. 13 is a flowchart illustrating a battery monitoring operation.

In the battery monitoring device having such a configuration, the power-transmission-side circuit 61 sequentially selects the four power transmission coils TC1 to TC4 by performing switching between ON and OFF of the switches SW1 to SW8 and performs a battery monitoring operation by sequentially activating and operating the power-reception-side circuits 71a to 71d corresponding thereto to exchange information. Such a battery monitoring operation will be described with reference to the flowchart of FIG. 13.

First, the battery monitoring device 500 is activated to perform initial setting of the device (step S301).

Next, the power-transmission-side circuit 61 selects and connects the power transmission coil TC1 by turning on the switches SW1 and SW2 and turning off the other switches SW3 to SW8 and causes the power transmission coil TC1 to generate a high-frequency magnetic field.

The power-transmission-side circuit 61 supplies power and a clock to the power reception circuit 700a via the power transmission coil TC1 and the power reception coil RC1 is magnetic-field coupled with the power transmission coil TC1. In the power reception circuit 700a, the voltage and temperature of the battery cell 72a are measured, and monitoring data is acquired. The power-reception-side circuit 71a transmits the monitoring data to the power-transmission-side circuit 61 together with an ID of NFC communication or other information. The power-transmission-side circuit 61 receives and inputs information including the monitoring data and causes the information to be stored in a memory (not illustrated) or the like (step S302).

The power-transmission-side circuit 61 selects and connects the power transmission coil TC2 by turning on the switches SW3 and SW4 and turning off the other switches SW1 and SW2 and SW5 to SW8 and causes the power transmission coil TC2 to generate a high-frequency magnetic field. As in the step S302, the power-transmission-side circuit 61 causes the power reception circuit 700b to be operated by supplying the power and the clock, receives the monitoring data including the information of the voltage and the temperature, and the other information related to the battery cell 72b and causes the monitoring data and the other information to be stored in the memory or the like (step S303).

The power-transmission-side circuit 61 selects and connects the power transmission coil TC3 by turning on the switches SW5 and SW6 and turning off the other switches SW1 to SW4, SW7 and SW8 and causes the power transmission coil TC3 to generate a high-frequency magnetic field. As in steps S301 and S302, the power-transmission-side circuit 61 causes the power reception circuit 700c to be operated by supplying power and a clock, receives monitoring data including information of a voltage and temperature and other information related to the battery cell 72c, and causes the monitoring data and the other information to be stored in the memory or the like (step S304).

The power-transmission-side circuit 61 selects and connects the power transmission coil TC4 by turning on the switches SW7 and SW8 and turning off the other switches SW1 to SW6 and causes the power transmission coil TC4 to generate a high-frequency magnetic field. As in steps S301, S302 and S303, the power-transmission-side circuit 61 causes the power reception circuit 700d to be operated by supplying power and a clock, receives monitoring data including information of a voltage and temperature and other information related to the battery cell 72d, and causes the monitoring data and the other information to be stored in a memory or the like (step S305).

The power-transmission-side circuit 61 determines whether or not the battery cells 72a to 72d are normal (that is, whether there is no abnormality) based on the acquired monitoring data (step S306). When it is determined that the battery cells 72a to 72d are not normal (that is, there is an abnormality) (step S306: No), the power-transmission-side circuit 61 reports the information of the abnormal battery cell to a host control device (not illustrated) (step S307) and proceeds to step S314.

On the other hand, when it is determined that the battery cells 72a to 72d are normal (that is, there is no abnormality) (step S306: Yes), the power-transmission-side circuit 61 calculates an average value of the voltages of the battery cells 72a to 72d based on the monitoring data. The power-transmission-side circuit 61 compares the voltage of each of the battery cells 72a to 72d with the average value, sets the number of high-voltage cells having high voltages which are a predetermined allowable width greater than the average value to M, and sets the number of low-voltage cells having low voltages which are the predetermined allowable width less than the average value to N (step S308).

The power-transmission-side circuit 61 determines whether M and N are both zero (that is, whether or not a difference between the voltage value of any battery cell and the average value falls within an allowable width) (S309). When it is determined that M and N are both zero (step S309: Yes), the process proceeds to step S314.

On the other hand, if it is determined that either one of M and N is not zero (step S309: No), the power-transmission-side circuit 61 determines whether or not N is less than M, i.e., determines whether or not the number of cells having low voltages which are the predetermined allowable width less than the average value is less than the number of cells having high voltages which are the predetermined allowable width greater than the average value (step S310).

When it is determined that N is greater than or equal to M (N is not less than M) (step S310: No), the power-transmission-side circuit 61 transmits a discharging instruction for issuing an instruction of forced discharging of M battery cells having a high voltage which is a predetermined allowable width greater than the average value via power transmission coils corresponding to the battery cells. The power-reception-side circuit connected to a battery cell which is a target to be forcibly discharged connects the resistor R4 to the battery cell by turning on the switch SW0 and forcibly discharges the battery cell (step S311).

On the other hand, if it is determined that N is less than M (step S310: Yes), the power-transmission-side circuit 61 causes power transmission coils corresponding to N battery cells having a low voltage which is the predetermined allowable width less than the average value to generate high-frequency magnetic fields and supplies power to power reception coils corresponding to the power transmission coils. The power-reception-side circuit charges the battery cell based on the supplied power (step S312).

The power-transmission-side circuit 61 determines whether or not to continue a battery monitoring operation (step S313). When it is determined that the battery monitoring operation will be continued (step S313: Yes), the power-transmission-side circuit 61 returns to step S302 and executes the monitoring operation of steps S302 to S305 again.

When it is determined that the battery monitoring operation will not be continued (step S313: No), the power-transmission-side circuit 61 causes the generation of the high-frequency magnetic field to be stopped and causes the operation of the battery monitoring device 500 to be stopped.

According to the above operations, battery monitoring and forced discharging of the battery cell group are performed while a target battery cell is switched according to switching of the switch.

According to the battery monitoring device 500 of the present embodiment, information of a plurality of battery cells having a potential difference from one another can be exchanged between the power-reception-side circuit connected to the plurality of battery cells and the power-transmission-side circuit having a potential different therefrom (for example, a vehicle body potential of a vehicle in the case of an electric vehicle). Although the potential of the battery cell significantly changes according to charging and discharging, it is possible to stably exchange information.

Also, because the power transmission circuit 600 and the power reception circuit 700 are electrically isolated, there is no leak current from any battery cell and no energy is wasted.

Also, because the power transmission coil and the power reception coil are arranged close to each other and some deviation and contamination are allowed, there is superiority in connection reliability and cost-effectiveness as compared with the case where an electrical contact point is provided.

Also, because it is possible to detect a state in which the power transmission coil and the power reception coil are disconnected from each other by measuring a high-frequency current of the power transmission coil, the connection reliability is high. Also, because a high-frequency magnetic field is used, there is no restriction on polarity and a direction.

Also, a range of the high-frequency magnetic field stays in the vicinity, and external malicious operation access and information leakage can be prevented. Also, prevention of information leakage and the like can be further strengthened by shielding with a magnetic sheet.

Also, because power is supplied to the power-reception-side circuit through a high-frequency magnetic field, an operation can be performed even if the battery cell is completely discharged.

By connecting an antenna coil of an NFC reader/writer to the power reception coil in a state in which the power reception circuit 700 is disconnected from the power transmission circuit 600, it is possible to activate and operate the power-reception-side circuit to read and write information in the nonvolatile memory and observe and control the battery cell. Thereby, a battery pack including the power reception circuit 700 can be used as a single NFC tag.

Also, by turning off all the switches SW1 to SW8 in the power-transmission-side circuit 61, it is possible to disconnect all the power transmission coils (TC1 to TC4). Accordingly, even when the power transmission coil and the power reception coil are disposed at positions where they can be coupled to each other, it is possible to access the battery cell from the power transmission coil of another reader/writer.

Because power of about several tens of milliwatts can be supplied to the power-reception-side circuit, it is possible to arrange an OP AMP circuit and an AD converter for measuring a voltage and a current and to perform advanced digital processing and processor processing. It is also possible to encrypt information to be exchanged and data to be recorded. Also, control of forced discharging of the battery cell and PWM operation are possible, and display by an LED or liquid crystal is possible.

When a magnetic field is weak, a circuit configured to shut off the connection of the battery cell side is provided in the power-reception-side circuit, so that a malfunction can be prevented even when unexpected magnetic-field coupling occurs.

Also, in the communication operation and the power-supply operation, because the load resistance connected to the resonance circuit including the power reception coil significantly changes, switching is performed on the resonance capacitor. Also, because load resistance is large at the time of startup, a parallel capacitor is configured to be large in order to operate the resonance circuit as a parallel resonance circuit.

Figure 14:
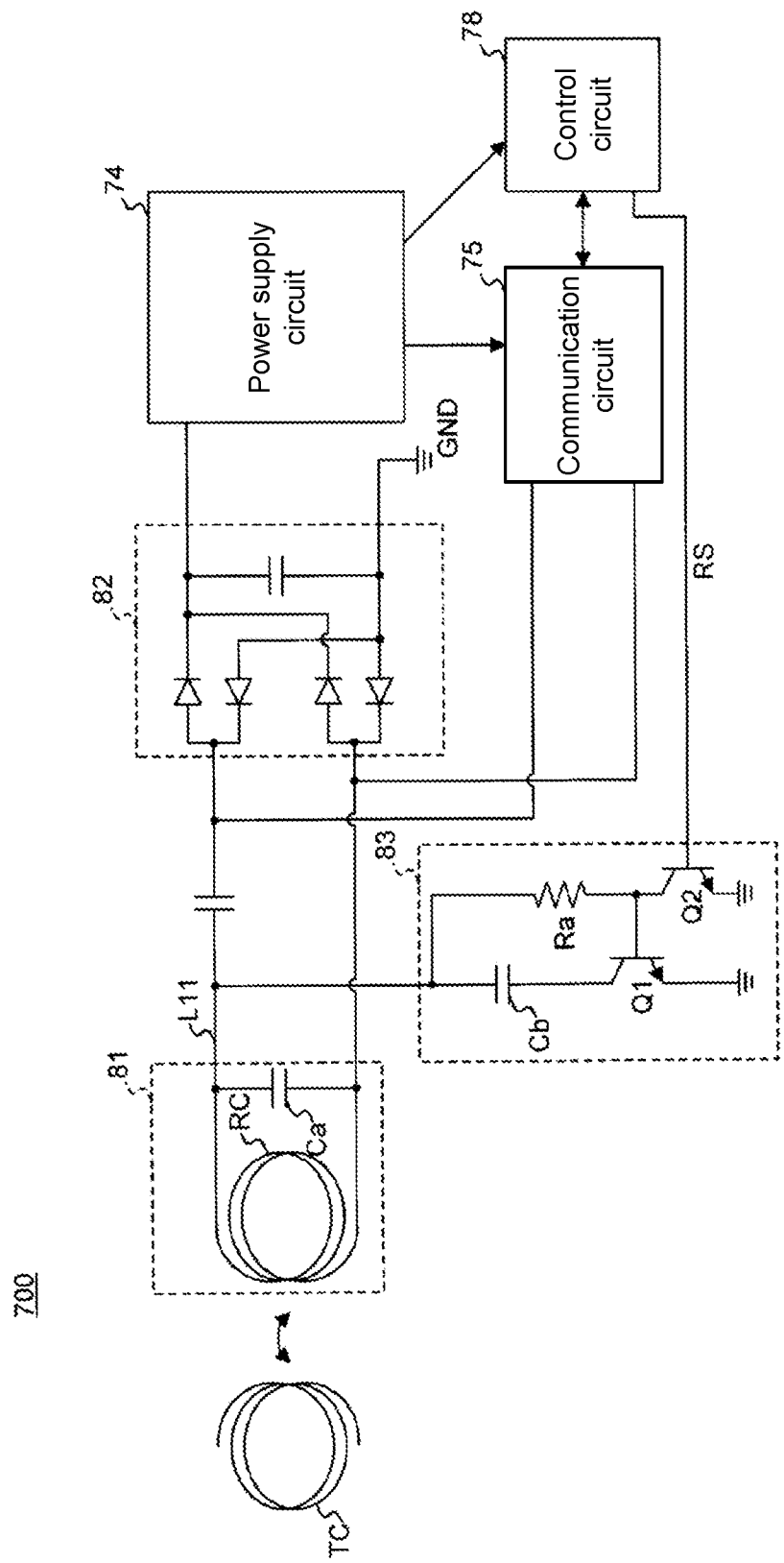
FIG. 14 is a diagram illustrating a circuit example in which the power-reception-side circuit has a resonance switching circuit.

FIG. 14 is a diagram illustrating a circuit example in which the power-reception-side circuit has a resonance switching circuit for switching between a communication operation and a power-supply operation.

A resonance switching circuit 83 is connected between a resonance circuit 81 including a power reception coil RC and a resonance capacitor Ca and a rectification circuit 82. The resonance switching circuit 83 has a capacitor Cb, a transistor Q1, a transistor Q2, and a resistor Ra.

One end of the capacitor Cb is connected to a line L11 which is one of connection lines connecting the resonance circuit 81 and the rectification circuit 82. The transistor Q1 is, for example, an N-channel type MOS transistor, a base thereof is grounded, and a drain thereof is connected to the other end of the capacitor Cb. The transistor Q2 is, for example, an N channel type MOS transistor, a base thereof is grounded and a drain thereof is connected to a gate of the transistor Q1. One end of the resistor Ra is connected to the one end of the capacitor Cb and the other end thereof is connected to a connection end of the gate of the transistor Q1 and the drain of the transistor Q2. Also, both or one of the transistors Q1 and Q2 may be an NPN bipolar transistor.

Switching of the resonance capacitor by the resonance switching circuit 83 is performed by supplying a resonance switching signal RS from the control circuit 78 to a gate of the transistor Q2.

At the time of startup, the resonance switching signal RS is at an L level (a ground level) and the transistor Q2 is turned off. When a magnetic field is applied, charge is supplied through the resistor Ra, a gate potential of the transistor Q1 increases, and the transistor Q1 is turned on. Thereby, the capacitor Cb is connected to the resonance circuit 81 and parallel capacitance increases.

By setting the resonance switching signal RS to an H level, the transistor Q2 is turned on and the gate potential of the transistor Q1 is pulled down to the ground potential, so that the transistor Q1 is turned off. Thereby, the capacitor Cb is disconnected from the resonance circuit 81, the resonance capacitance decreases, and a state suitable for power transmission is reached. Also, the resistor Ra may be connected between the output of the rectification circuit 82 and the gate of the transistor Q1. By applying a magnetic field, charge can be similarly supplied and each transistor can be turned on.

Figure 15:
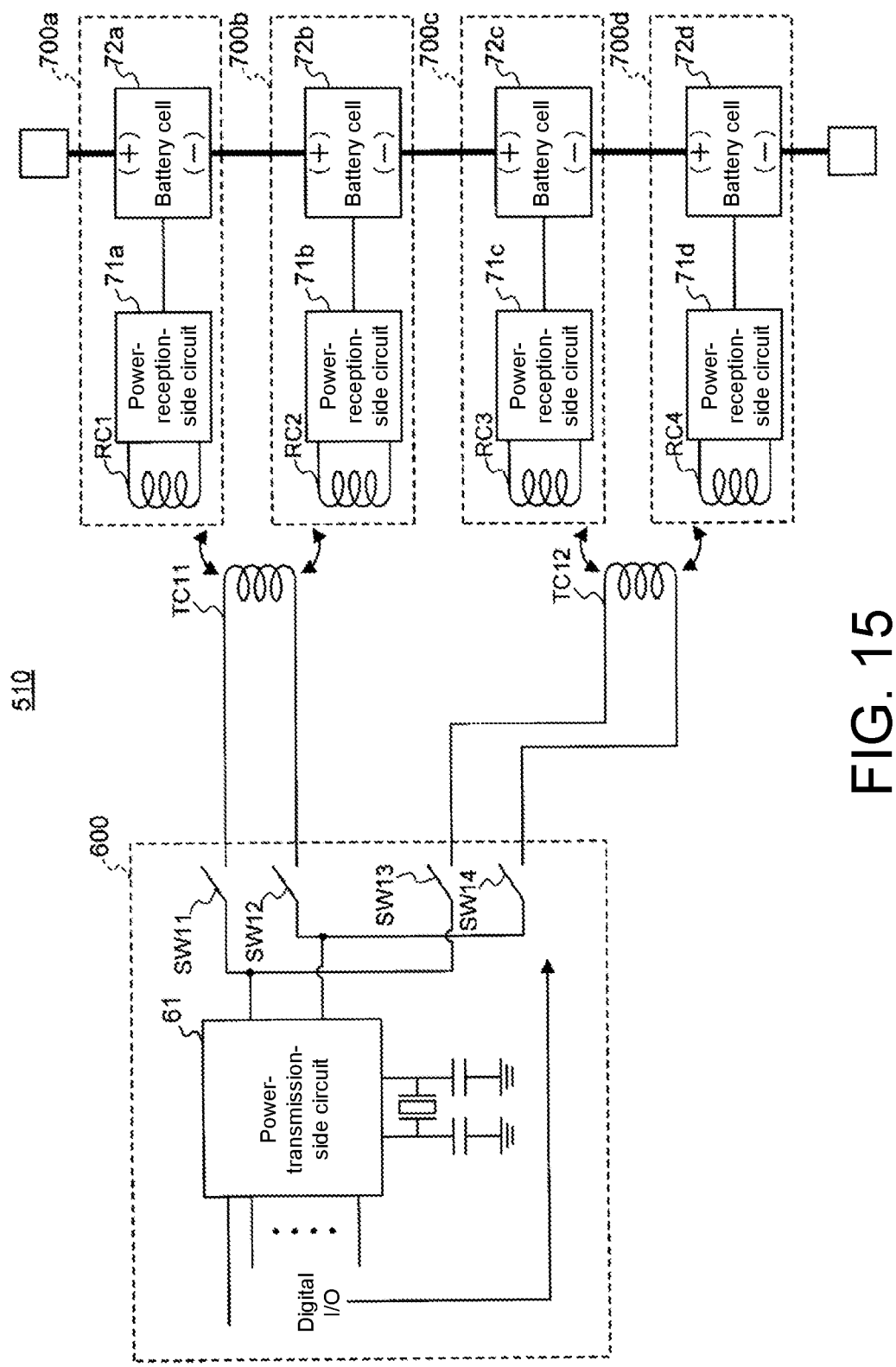
FIG. 15 is a block diagram illustrating another configuration example of the battery monitoring device.

FIG. 15 is a block diagram illustrating a configuration of a battery monitoring device 510 which is another configuration example of the battery monitoring device of the present embodiment. The power-transmission-side circuit 61 is connected to power transmission coils TC11 and TC12 via the switches SW11 to SW14. The power transmission coil TC11 is arranged at a position where magnetic-field coupling with the power reception coils RC1 and RC2 is possible. The power transmission coil TC12 is arranged at a position where magnetic-field coupling with the power reception coils RC3 and RC4 is possible.

The power-transmission-side circuit 61 controls ON/OFF of the switches SW11 to SW14 to select either one of the two power transmission coils TC11 and TC12, transmits a high-frequency signal of 13.56 MHz, and causes the selected power transmission coil to generate a high-frequency magnetic field.

When the power transmission coil TC11 is selected, the selected power transmission coil TC11 has magnetic-field coupling with either one of the power reception coils RC1 and RC2. When the power transmission coil TC12 is selected, the selected power transmission coil TC11 is magnetic-field coupled with either one of the power reception coils RC3 and RC4. Thereby, a high-frequency electromotive force is generated by electromagnetic induction in any one of the power reception coils RC1 to RC4.

According to this configuration, it is possible to reduce the number of power transmission coils and the number of wiring lines, as compared with the battery monitoring device illustrated in FIG. 10.

Next, an antenna structure (a coil structure) in the battery monitoring device 500 illustrated in FIG. 10 will be described with reference to FIGS. 16(a) and 16(b). In the following description, the power transmission coil is also referred to as a power transmission antenna, and the power reception coil is also referred to as a power reception antenna.

As illustrated in FIG. 16(a), the power reception antenna is arranged on a side surface of a battery pack BP. The battery pack BP stores battery cells, and has, for example, a rectangular parallelepiped shape. A power-reception-side circuit configured as an integrated circuit is connected to each power reception antenna.

The power transmission antenna is configured in a spiral conductor pattern inside a flat isolator medium IM or on a surface thereof in a strip shape, a tape shape, a string shape, a plate shape, and the like and is connected to a selection switch of the power-transmission-side circuit according to a linear conductor pattern. Each power transmission antenna may be independently connected to the power-transmission-side circuit or may be connected to the power-transmission-side circuit in a form branching from the middle.

As illustrated in FIG. 16(b), each power transmission antenna is arranged overlapping the corresponding power reception antenna. The power transmission antenna and the power reception antenna are fixed by various types of means such as screwing, incorporation into a frame structure, an adhesive tape, and adsorption by a permanent magnet.

According to this configuration, the power reception coil arranged in the battery pack does not become a protrusion. Although it is desirable that the periphery of the power reception coil be a nonmagnetic material or an isolator, an operation is possible even with some magnetism and conductivity.

Also, attachment and detachment are facilitated, and connection reliability is superior as compared with the case in which electrical contact points are provided. Also, even if there is a slight air gap, dirt, or wetting between the power transmission coil and the power reception coil, an operation can be performed.

Also, even if there is an error in a disconnection or a connection combination, it is possible to detect an abnormality through ID confirmation of NFC communication.

Also, because a signal is suitable for an automatic production line and is a high-frequency signal, an operation can be performed regardless of a direction of a winding direction of the coil.

Figure 17:
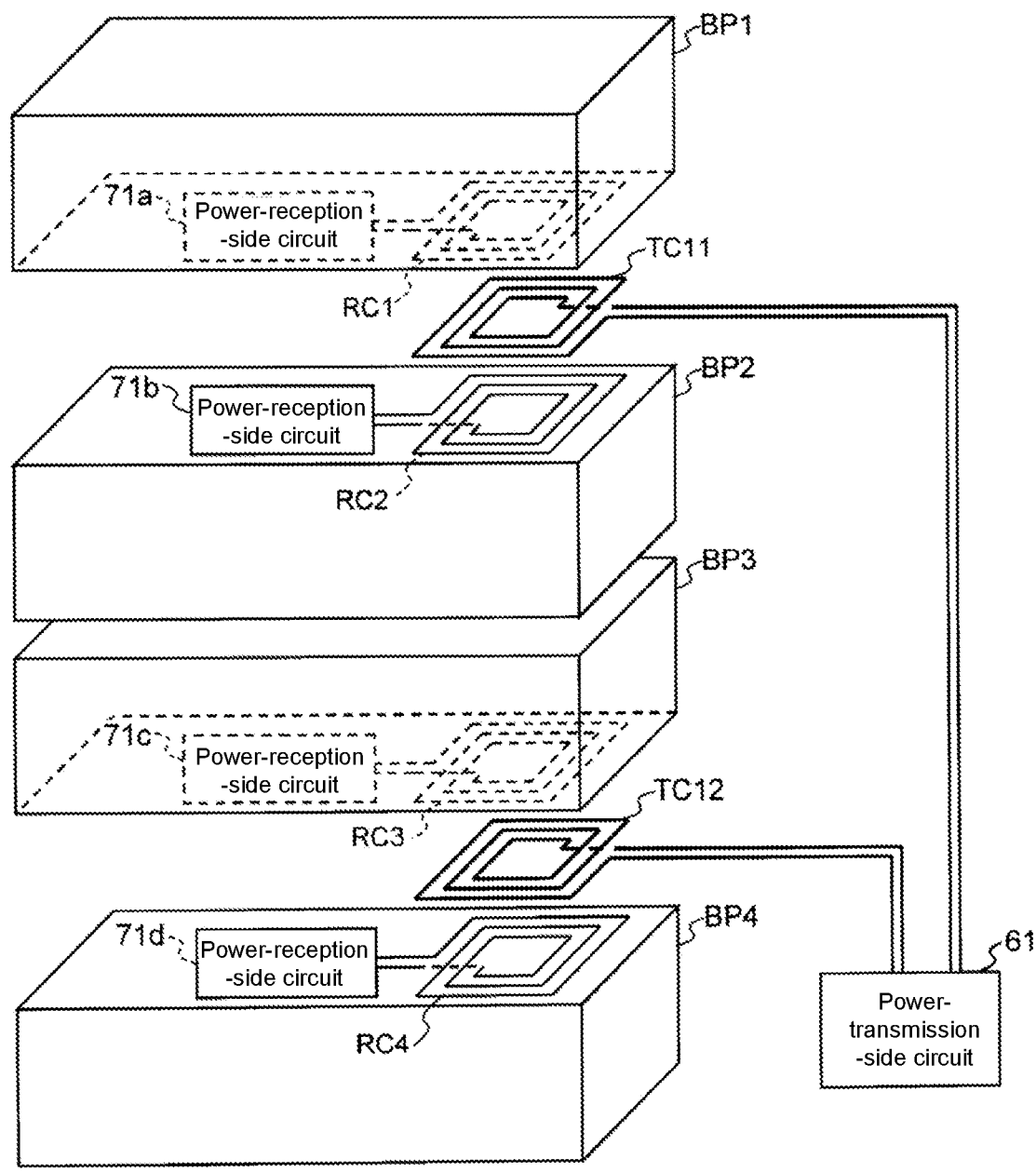
FIG. 17 is a diagram schematically illustrating an antenna structure of the battery monitoring device.

Next, the antenna structure (the coil structure) in the battery monitoring device illustrated in FIG. 15 will be described with reference to FIG. 17.

Two power reception coils are provided on adjacent surfaces (for example, a bottom surface and an upper surface) of two adjacent battery packs (BP1 and BP2 or BP3 and BP4) and are arranged facing each other. One power transmission coil is arranged to be sandwiched between the two power reception coils (that is, between the adjacent surfaces of the two battery packs).

According to this configuration, it is possible to reduce the number of power transmission coils and the number of wiring lines without increasing an area and a volume and to implement an inexpensive, compact, and lightweight device.

Figure 18A:
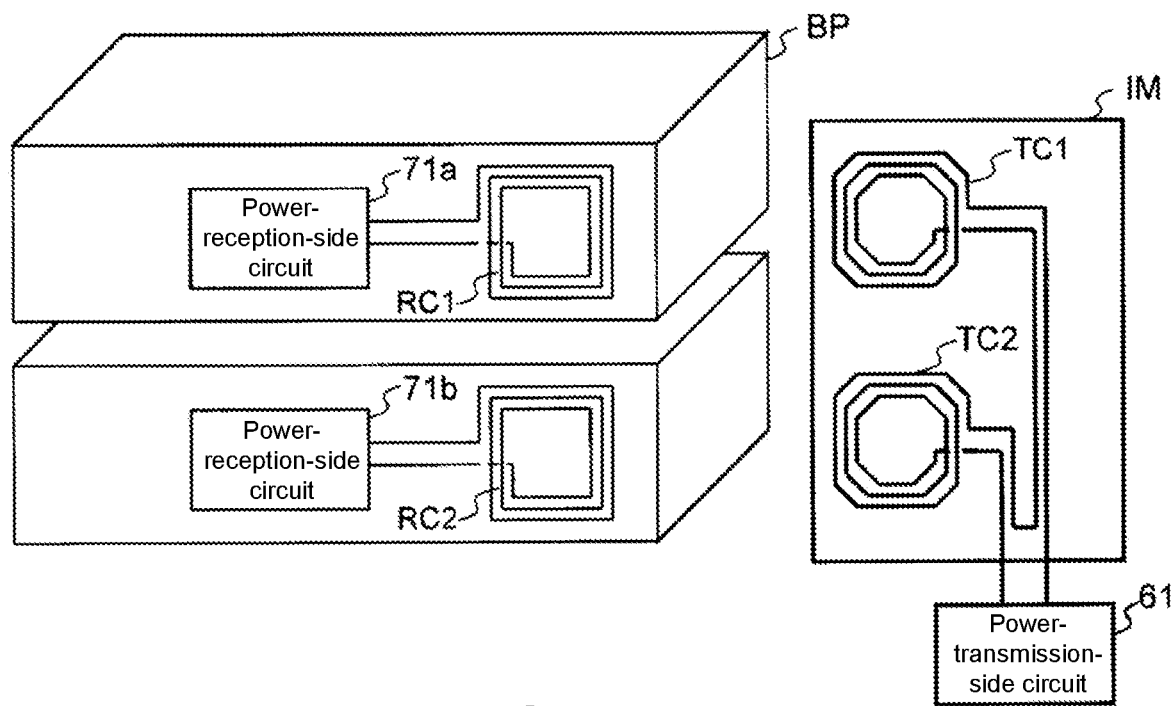
FIG. 18($a$) and FIG. 18($b$) are diagrams illustrating a configuration example of a power transmission coil.
Figure 18B:
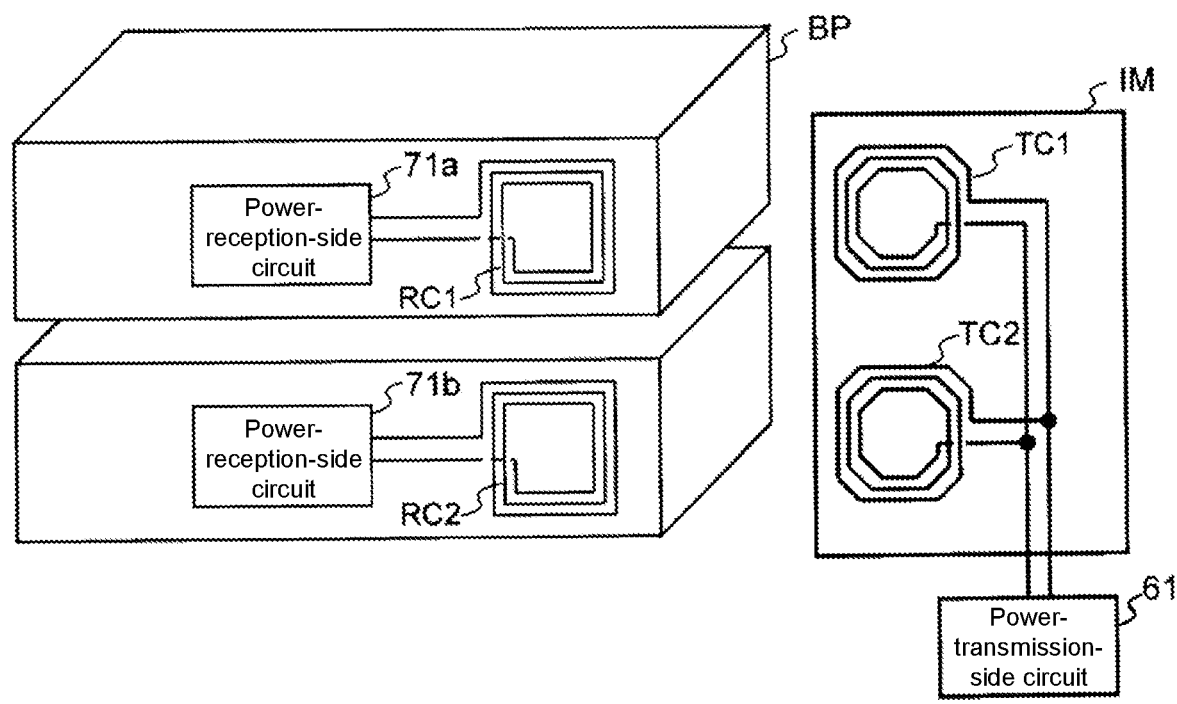

Also, the configuration of the power transmission coil may be configured by connecting two power transmission coils TC1 and TC2 in series as illustrated in FIG. 18(a) and configured by connecting the two power transmission coils TC1 and TC2 in parallel as illustrated in FIG. 18(b).

Figure 19:
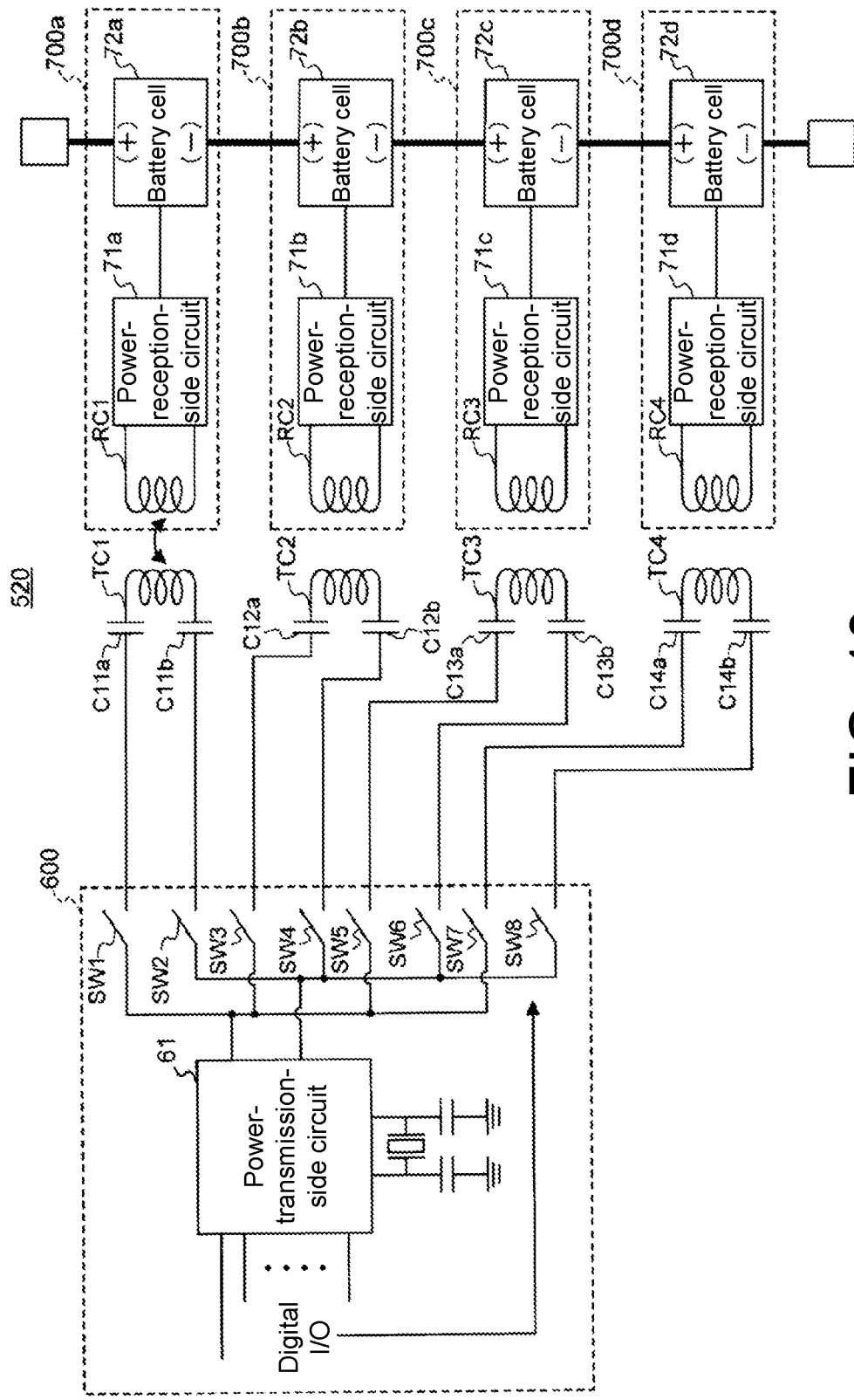
FIG. 19 is a block diagram illustrating a configuration of the battery monitoring device in which a capacitor is connected in series to the power transmission coil.

Also, a capacitor may be connected in series to the power transmission coil on a connection line (a signal path) between the power-transmission-side circuit 61 and each power transmission coil. FIG. 19 is a block diagram illustrating a configuration of a battery monitoring device 520 having such a configuration.

A capacitor C11a is connected between one end of the power transmission coil TC1 and the switch SW1 and a capacitor C11b is connected between the other end of the power transmission coil TC1 and the switch SW2. A capacitor C12a is connected between one end of the power transmission coil TC2 and the switch SW3 and a capacitor C12b is connected between the other end of the power transmission coil TC2 and the switch SW4. A capacitor C13a is connected between one end of the power transmission coil TC3 and the switch SW5 and a capacitor C13b is connected between the other end of the power transmission coil TC3 and the switch SW6. A capacitor C14a is connected between one end of the power transmission coil TC4 and the switch SW7 and a capacitor C14b is connected between the other end of the power transmission coil TC4 and the switch SW8.

Figure 20:
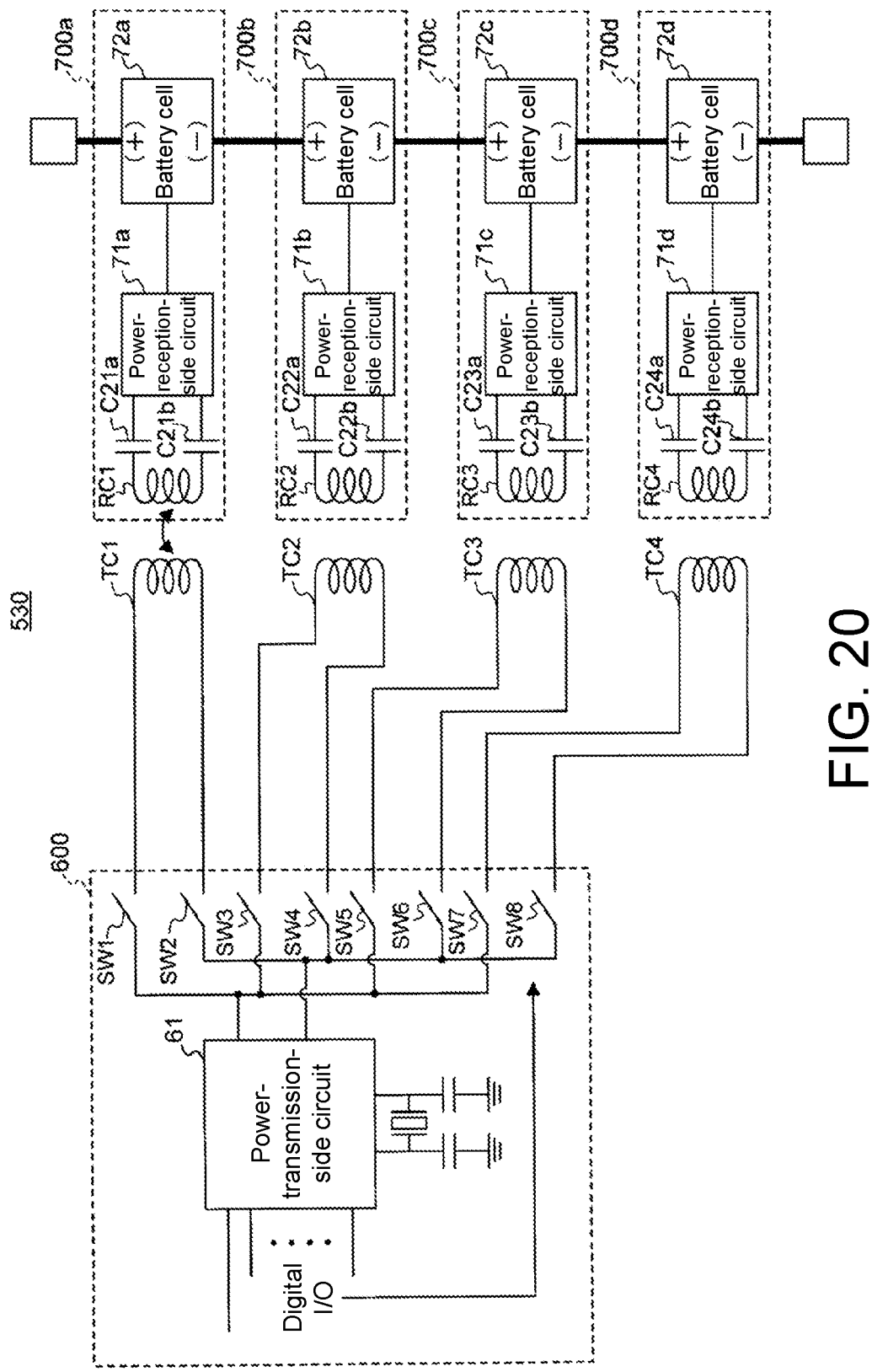
FIG. 20 is a block diagram illustrating a configuration of the battery monitoring device in which a capacitor is connected in series to a power reception coil.

Also, a capacitor may be connected in series to the power reception coil on a connection line (a signal path) between each power reception coil and the power-reception-side circuit. FIG. 20 is a block diagram illustrating a configuration of a battery monitoring device 530 having such a configuration.

Capacitors C21a and C21b are connected between the power reception coil RC1 and the power-reception-side circuit 71a. Capacitors C22a and C22b are connected between the power reception coil RC2 and the powerreception-side circuit 71b. Capacitors C23a and C23b are connected between the power reception coil RC3 and the power-reception-side circuit 71c. Capacitors C24a and C24b are connected between the power reception coil RC4 and the power-reception-side circuit 71d.

Although a high-frequency current of 13.56 MHz flows through the power transmission coil and the power reception coil, an operation can be performed as in the case in which the capacitors are not connected in series because the high-frequency current is applied even when the capacitors are connected in series.

In this manner, by connecting the capacitors in series to the signal path of the power transmission coil or the power reception coil, a DC can be blocked. Although the power transmission coil and the power reception coil are originally isolated, it is possible to prevent fire and electric shock accidents due to electric leakage and short circuiting according to a DC element of a capacitor even if isolation breakdown occurs due to medium damage, moisture intrusion into a crack, or the like.

Embodiment 4

A battery monitoring device of the present embodiment is different from the battery monitoring device of the third embodiment in that the power transmission circuit is duplexed.

Figure 21:
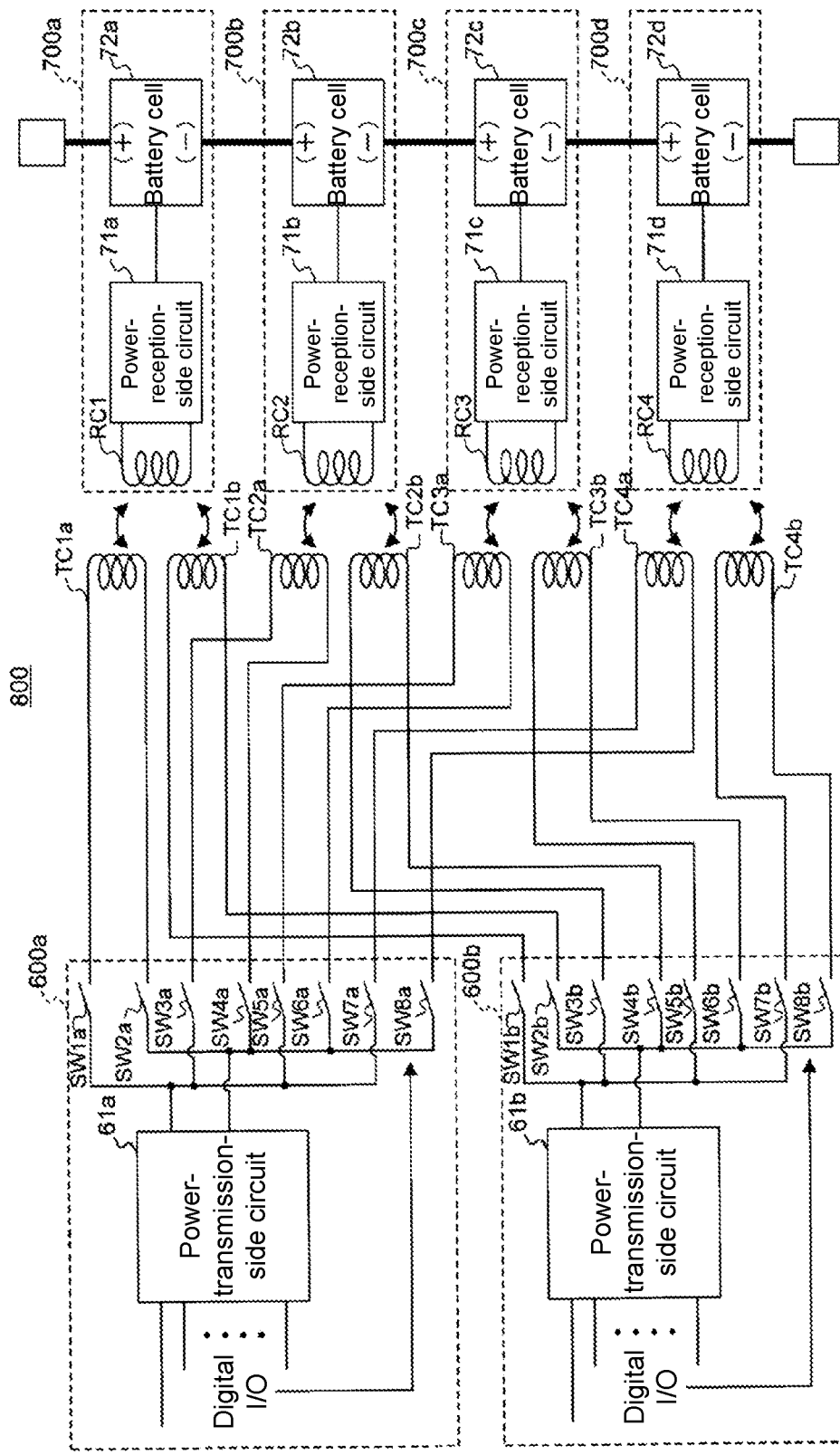
FIG. 21 is a block diagram illustrating a configuration of a battery monitoring device according to Embodiment 4.

FIG. 21 is a block diagram illustrating a configuration of a battery monitoring device 800 of the present embodiment. The battery monitoring device 800 includes a first power transmission circuit 600a and a second power transmission circuit 600b.

The first power transmission circuit 600a includes a power-transmission-side circuit 61a and switches SW1a to SW8a. The power-transmission-side circuit 61a is connected to one of power transmission coils TC1a, TC2a, TC3a, and TC4a in accordance with ON/OFF of the switches SW1a to SW8a.

The second power transmission circuit 600b has a power-transmission-side circuit 61b and switches SW1b to SW8b. The power-transmission-side circuit 61b is connected to any one of power transmission coils TC1b, TC2b, TC3b, and TC4b in accordance with ON/OFF of the switches SW1b to SW8b.

Figure 22:
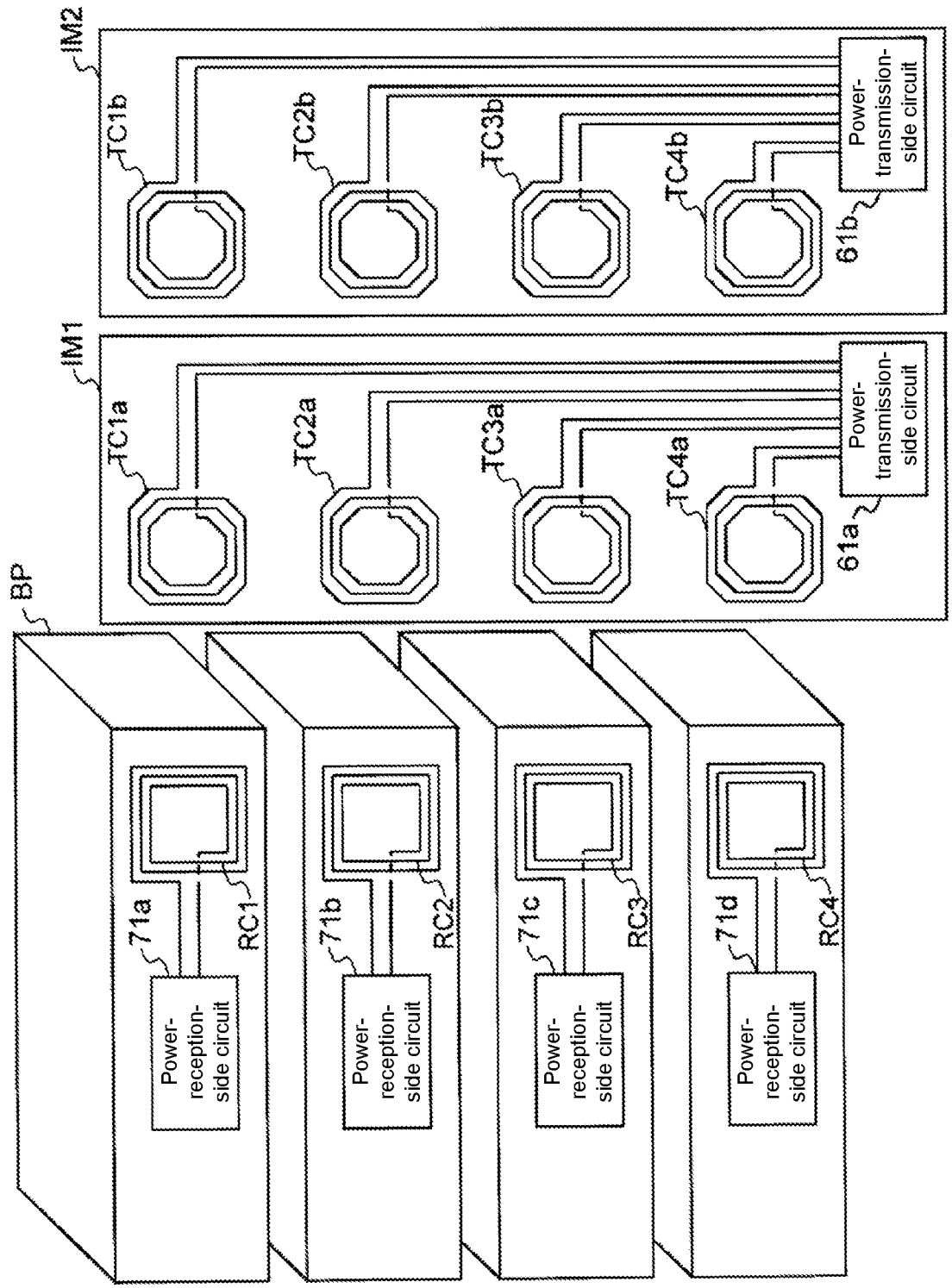
FIG. 22 is a diagram schematically illustrating an antenna structure of the battery monitoring device.

FIG. 22 is a diagram illustrating an antenna structure (a coil structure) of the battery monitoring device 800. The power reception antenna is arranged on a side surface of a battery pack BP having, for example, a rectangular parallelepiped shape for storing battery cells, and a power-reception-side circuit configured as an integrated circuit is connected thereto. In both the first power transmission circuit 600a and the second power transmission circuit 600b, the power transmission antenna is configured inside isolator media IM1 and IM2 or on surfaces thereof according to a spiral conductor pattern and is connected to a selection switch of the power-transmission-side circuit according to a linear conductor pattern.

Figure 23:
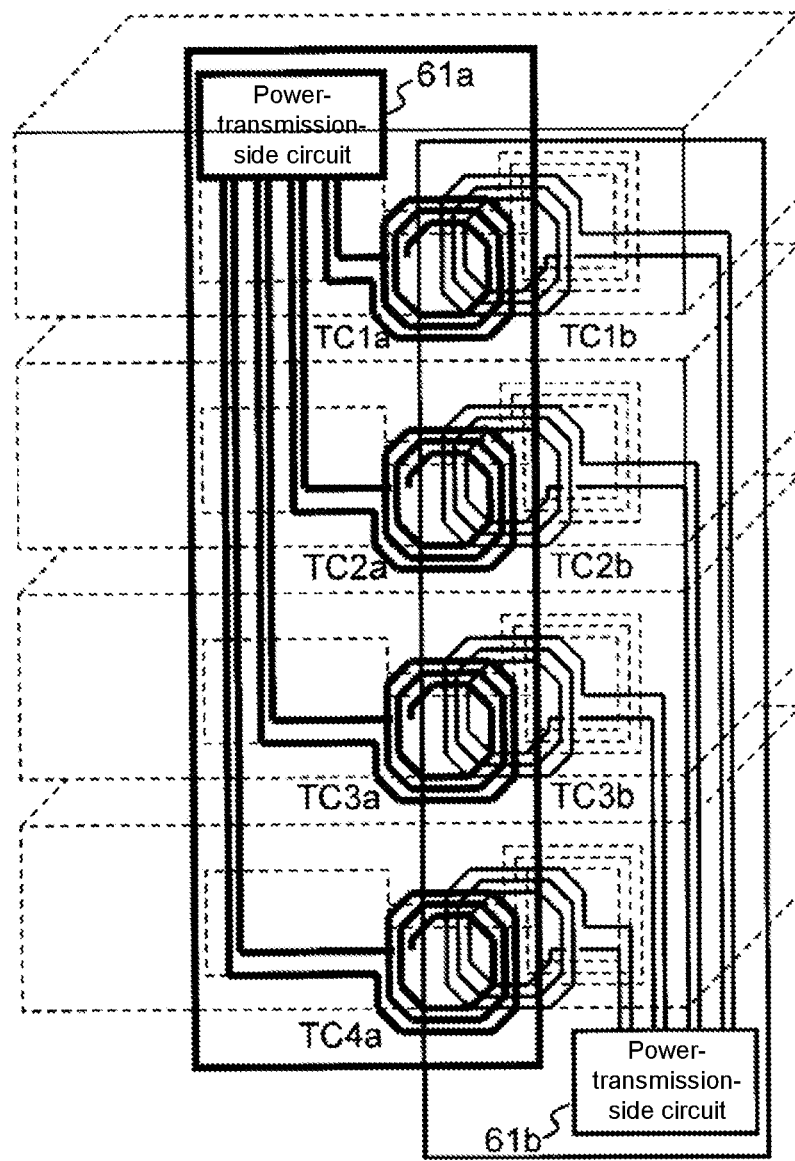
FIG. 23 is a diagram schematically illustrating an antenna structure of the battery monitoring device.

As illustrated in FIG. 23, the power transmission antennas of the first power transmission circuit 600a and the second power transmission circuit 600b are arranged so that a central axis of any coil therein overlaps a central axis of the corresponding power reception coil.

Referring again to FIG. 21, in the operation of the battery monitoring device 800, control is performed so that one of the power-transmission-side circuit 61a of the first power transmission circuit 600a and the power-transmission-side circuit 61b of the second power transmission circuit 600b is in an operation state (an operation system) and the other thereof is in a standby state (a standby system).

For example, when the power-transmission-side circuit 61a is the operation system and the power-transmission-side circuit 61b is the standby system, the switches SW1a to SW8a are controlled so that they are turned on or off by a host control circuit (not illustrated) and the power-transmission-side circuit 61a is connected to any one of the power transmission coils TC1a, TC2a, TC3a, and TC4a. The power-transmission-side circuit 61a exchanges information with a power-reception-side circuit (any one of 71a to 71d) corresponding to the power reception coil (any one of RC1 to RC4) coupled to the connected power transmission coil. At this time, all the switches SW1b to SW8b in the second power transmission circuit 600b are controlled so that they are turned off.

When switching is performed between the operation state and the standby state, all the switches SW1a to SW8a in the first power transmission circuit 600a are turned off. The second power transmission circuit 600b controls ON or OFF of the switches SW1b to SW8b so that the power transmission circuit 61b is connected to any one of the power transmission coils TC1b, TC2b, TC3b, and TC4b. Thereby, the power-transmission-side circuit 61b exchanges information with the power-reception-side circuit (any one of the power-reception-side circuits 71a to 71d) corresponding to the power reception coil (any one of RC1 to RC4) coupled to the connected power transmission coil.

According to the battery monitoring device of FIG. 21, because an information transmission path is duplexed, it is possible to perform an operation in the other circuit even if a failure occurs in one circuit. Thereby, a highly reliable device can be implemented.

Also, because all selection switches of the power-transmission-side circuit of the standby system are controlled so that they are turned off, there is no connection to the power-transmission-side circuit of the standby system. Thereby, it is possible to reduce the influence of the power-transmission-side circuit of the standby system on the transmission operation of the power-transmission-side circuit of the operation system and implement more reliable exchange of information.

Also, because a magnetic-field coupling part is duplexed, interference between the operation system and the standby system is little.

Also, because the power-transmission-side circuit of the operation system and the power-transmission-side circuit of the standby system can be identified according to the ID of the NFC communication or the like, it is possible to reliably detect an abnormality such as a disconnection or a connection error.

Also, the embodiments of the invention are not limited to the above-described embodiments. Although an example using a high-frequency magnetic field of 13.56 MHz has been described, a magnetic field having a frequency in a different frequency band, for example, such as 100 kHz or 6.78 MHz, may be used, for example, in the above-described embodiment. Also, an electromagnetic field of several hundred MHz may be used. By designing a power transmission antenna (a power transmission coil) and a power reception antenna (a power reception coil) suitable for each frequency, it is possible to configure a device that performs similar operations using magnetic fields or electromagnetic fields of these frequencies.

Also, the configuration of the signal transmission device and the battery monitoring device of the embodiments of the invention can be used for high-voltage devices in addition to battery monitoring and power line monitoring.

Also, a position of a transmission side and a position of a reception side may be varied, or the power transmission coil and the power reception coil may be configured to rotate with each other. Also, the power transmission side and the power reception side may be configured to be detachable.

Also, the signal transmission device and the battery monitoring device of the embodiments of the invention may be operated in an environment such as underwater, in oil, or in cosmic space.

Waterproofing or airtight processing may be applied to the power transmission coil and the power reception coil. Also, a magnetic sheet may be used to magnetically shield the power transmission coil and the power reception coil from the outside. Also, a filter for suppressing harmonics may be used.

Also, an example of a battery monitoring device configured to monitor four battery cells has been described in the above-described Embodiments 3 and 4. However, the number of battery cells is not limited thereto and the battery monitoring device is configured as a battery monitoring device that monitors n (n is an integer greater than or equal to 2) battery cells, wherein the number of power transmission coils, the number of power reception coils, and the number of power-reception-side circuits are set as n.

What is claimed is:

1. A power transmission circuit connected to an operation device including an operation circuit configured to perform an operation based on a first voltage from a power supply, a measurement circuit configured to obtain measurement data by measuring an electrical signal using the first voltage as a reference, and a process control circuit configured to operate based on a second voltage obtained by converting the first voltage into a voltage with a voltage level less than the first voltage and control an operation of the operation circuit based on the measurement data, and configured to perform transmission and reception of a signal to and from a power reception circuit connected to the measurement circuit, the power transmission circuit comprising:
    a power-transmission-side resonance circuit including a power transmission coil and a power-transmission-side resonance capacitor, wherein the power transmission circuit is configured to wirelessly perform transmission of power from the process control circuit to the power reception circuit by an alternating current (AC) magnetic field from the power transmission coil and to receive the measurement data from the power reception circuit and supply the received measurement data to the process control circuit.

2. The power transmission circuit according to claim 1, further comprising:
    a driving circuit including a current measurement circuit that measures a driving current to the power transmission coil and configured to generate the AC magnetic field according to the driving current; and
    a driving control circuit configured to control the driving circuit.

3. The power transmission circuit according to claim 1, wherein the power transmission coil includes:
    a wiring part arranged on a first wiring layer in a substrate having a plurality of wiring layers and including a continuous conductor wire having one end connected to the power-transmission-side resonance capacitor;
    a spiral part having first and second ends and a conductor wire part, wherein the first end is connected to the power-transmission-side resonance capacitor and the conductor wire part includes a spiral continuous conductor wire arranged on the first wiring layer and crosses a space between the second end and an other end of the wiring part; and
    a connection part including a continuous conductor wire part arranged on a second wiring layer of the substrate and configured to connect the second end of the spiral part and the other end of the wiring part via a pair of vias provided between the first wiring layer and the second wiring layer.

4. A power reception circuit connected to an operation device including an operation circuit configured to perform an operation based on a first voltage from a power supply, a measurement circuit configured to obtain measurement data by measuring an electrical signal using the first voltage as a reference, and a process control circuit configured to operate based on a second voltage obtained by converting the first voltage into a voltage with a voltage level less than the first voltage and control an operation of the operation circuit based on the measurement data, and configured to perform transmission and reception of a signal to and from a power transmission circuit connected to the process control circuit, the power reception circuit comprising:
    a power-reception-side resonance circuit including a power reception coil and a power-reception-side resonance capacitor, wherein the power reception circuit is configured to supply a power wirelessly transmitted from the power transmission circuit to the power reception coil by an AC magnetic field to the measurement circuit and transmit the measurement data obtained from the measurement circuit to the power transmission circuit.

5. The power reception circuit according to claim 4, further comprising:
    a load switching circuit, configured to perform switching of a state of a load connected to the power-reception-side resonance circuit in accordance with a load switching signal.

6. The power reception circuit according to claim 4, wherein
    the power reception coil comprises:
    a wiring part arranged on a second wiring layer and including a continuous conductor wire having one end connected to the power-reception-side resonance capacitor;
    a spiral part having first and second ends and a conductor wire part, wherein the first end is connected to the power-reception-side resonance capacitor and the conductor wire part comprises a spiral continuous conductor wire arranged on the second wiring layer and crosses a space between the second end and an other end of the wiring part; and
    a connection part including a continuous conductor wire part arranged on a first wiring layer and configured to connect the second end of the spiral part and the other end of the wiring part via a pair of vias provided between the first wiring layer and the second wiring layer.

* * * * *